United States Patent
White et al.

(10) Patent No.: US 10,304,713 B2
(45) Date of Patent: May 28, 2019

(54) SUBSTRATE CARRIER WITH INTEGRATED ELECTROSTATIC CHUCK

(71) Applicant: Applied Materials, Inc., Santa Clara, CA (US)

(72) Inventors: John M. White, Hayward, CA (US); Zuoqian Wang, Dublin, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 198 days.

(21) Appl. No.: 14/916,676

(22) PCT Filed: Sep. 18, 2014

(86) PCT No.: PCT/US2014/056380
§ 371 (c)(1),
(2) Date: Mar. 4, 2016

(87) PCT Pub. No.: WO2015/042304
PCT Pub. Date: Mar. 26, 2015

(65) Prior Publication Data
US 2016/0211162 A1    Jul. 21, 2016

Related U.S. Application Data

(60) Provisional application No. 61/991,342, filed on May 9, 2014, provisional application No. 61/880,796, filed on Sep. 20, 2013.

(51) Int. Cl.
*H01L 21/683* (2006.01)
*H01L 21/677* (2006.01)
(Continued)

(52) U.S. Cl.
CPC ........ *H01L 21/6833* (2013.01); *C23C 14/042* (2013.01); *C23C 14/12* (2013.01);
(Continued)

(58) Field of Classification Search
USPC .................................. 361/230, 234
See application file for complete search history.

(56) References Cited

U.S. PATENT DOCUMENTS

| | | |
|---|---|---|
| 5,184,398 A | 2/1993 | Moslehi |
| 6,678,143 B2 | 1/2004 | Masuda et al. |
| | (Continued) | |

FOREIGN PATENT DOCUMENTS

| | | |
|---|---|---|
| CN | 1650416 A | 8/2005 |
| CN | 102683255 A | 9/2012 |
| | (Continued) | |

OTHER PUBLICATIONS

H. Stieglauer et al, Mobile Electrostatic Carrier (MEC) Evaluation for a GaAs Wafer Backside Manufacturing Process, CS MANTECH Conference, May 17-20, 2010, Portland, Oregon, USA, 5 pages.
(Continued)

*Primary Examiner* — Danny Nguyen
(74) *Attorney, Agent, or Firm* — Patterson & Sheridan, LLP

(57) ABSTRACT

A substrate carrier adapted to use in a processing system includes an electrode assembly and a support base. The electrode assembly is configured to generate an electrostatic chucking force for securing a substrate to the substrate carrier. The support base has a heating/cooling reservoir formed therein. The electrode assembly and the support base form an unitary body configured for transport within a processing system. A quick disconnect is coupled to the body and configured to trap a heat regulating medium in the reservoir heating/cooling reservoir when the body is decoupled from a source of heat regulating medium.

18 Claims, 15 Drawing Sheets

(51) Int. Cl.

| | |
|---|---|
| *C23C 14/04* | (2006.01) |
| *C23C 14/12* | (2006.01) |
| *C23C 14/24* | (2006.01) |
| *C23C 14/50* | (2006.01) |
| *C23C 14/54* | (2006.01) |
| *C23C 14/56* | (2006.01) |
| *C23C 16/34* | (2006.01) |
| *C23C 16/40* | (2006.01) |
| *C23C 16/458* | (2006.01) |
| *C23C 16/46* | (2006.01) |
| *C23C 16/54* | (2006.01) |
| *F26B 3/00* | (2006.01) |
| *F27B 1/08* | (2006.01) |
| *H01L 21/67* | (2006.01) |
| *H01L 21/673* | (2006.01) |
| *H05B 3/03* | (2006.01) |
| *C23C 16/04* | (2006.01) |
| *C23C 16/455* | (2006.01) |

(52) U.S. Cl.
CPC .............. *C23C 14/24* (2013.01); *C23C 14/50* (2013.01); *C23C 14/541* (2013.01); *C23C 14/562* (2013.01); *C23C 16/345* (2013.01); *C23C 16/401* (2013.01); *C23C 16/4587* (2013.01); *C23C 16/463* (2013.01); *C23C 16/545* (2013.01); *F26B 3/00* (2013.01); *F27B 1/08* (2013.01); *H01L 21/6732* (2013.01); *H01L 21/67109* (2013.01); *H01L 21/67706* (2013.01); *H01L 21/67712* (2013.01); *H01L 21/67718* (2013.01); *H01L 21/67742* (2013.01); *H05B 3/03* (2013.01); *C23C 16/042* (2013.01); *C23C 16/45578* (2013.01)

(56) References Cited

U.S. PATENT DOCUMENTS

| | | |
|---|---|---|
| 6,768,627 B1 | 7/2004 | Kitabayashi et al. |
| 6,781,812 B2 | 8/2004 | Fuwa et al. |
| 7,508,646 B2 * | 3/2009 | Emoto ................... G03F 7/707 361/230 |
| 7,881,036 B2 | 2/2011 | Fujisawa et al. |
| 7,916,447 B2 | 3/2011 | Kobayashi et al. |
| 8,125,756 B2 | 2/2012 | Poh |
| 8,238,072 B2 | 8/2012 | Fujisawa et al. |
| 8,325,457 B2 | 12/2012 | Park et al. |
| 8,335,070 B2 | 12/2012 | Poh |
| 8,503,156 B2 | 8/2013 | Ray et al. |
| 8,570,704 B2 * | 10/2013 | Maeda ............. H01L 21/67742 361/230 |
| 8,730,644 B2 | 5/2014 | Fujisawa et al. |
| 9,287,806 B2 | 3/2016 | Park |
| 2001/0016302 A1 | 8/2001 | Hirayanagi et al. |
| 2006/0076108 A1 | 4/2006 | Holland et al. |
| 2008/0062609 A1 | 3/2008 | Himori et al. |
| 2008/0089002 A1 * | 4/2008 | Pelrine ................... H02N 13/00 361/234 |
| 2008/0220622 A1 * | 9/2008 | Goodman ......... H01L 21/67103 438/800 |
| 2011/0227275 A1 | 9/2011 | Poh et al. |
| 2011/0292561 A1 | 12/2011 | Kamimura et al. |
| 2012/0227886 A1 | 9/2012 | Hsiao et al. |
| 2012/0308341 A1 | 12/2012 | Ishizawa et al. |
| 2015/0331337 A1 | 11/2015 | Sundarrajan et al. |
| 2016/0064267 A1 | 3/2016 | Toh et al. |

FOREIGN PATENT DOCUMENTS

| | | |
|---|---|---|
| CN | 102738048 A | 10/2012 |
| EP | 0734053 A1 | 9/1996 |
| JP | H04237148 A | 8/1992 |
| JP | 2002-357838 A | 12/2002 |
| JP | 2003-179128 A | 6/2003 |
| JP | 2003-243493 A | 8/2003 |
| JP | 2007096056 A | 4/2007 |
| JP | 2007157886 A | 6/2007 |
| JP | 2010199177 A | 9/2010 |

OTHER PUBLICATIONS

F. Poh et al, Non-Contact Transportation System for Thin Glass Plate Utilizing Combination of Air Bearing and Electrostatic Force, SICE Jul. 28-30, 1999, Morioka, 6 pages.

International Search Report and Written Opinion, PCT/US2014/058380, dated Dec. 17, 2014.

Office Action from Chinese Patent Application No. 201480051500.6 dated Mar. 21, 2018.

Office Action from Chinese Patent Application No. 201480051682.7 dated Jan. 26, 2018.

Office Action from Taiwan Application No. 103132563 dated May 7, 2018.

Office Action from Taiwanese Patent Application No. 103132562 dated May 25, 2018.

Office Action from Chinese Patent Application No. 201480051682.7 dated Oct. 12, 2018.

Office Action from Japanese Patent Application No. 2016-515515 dated Jul. 31, 2018.

* cited by examiner

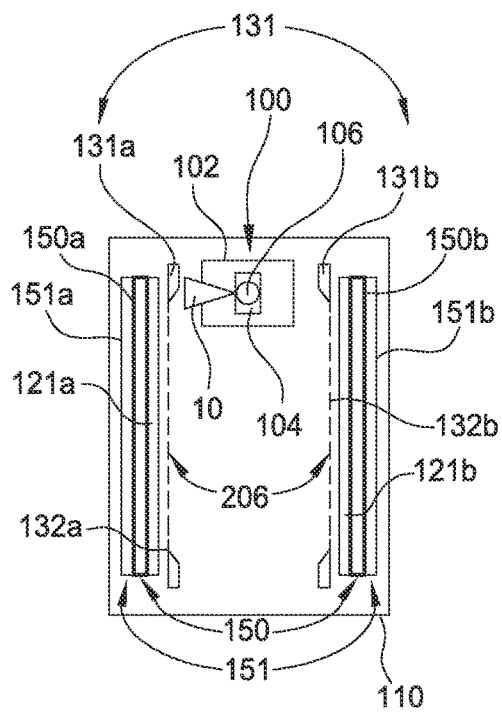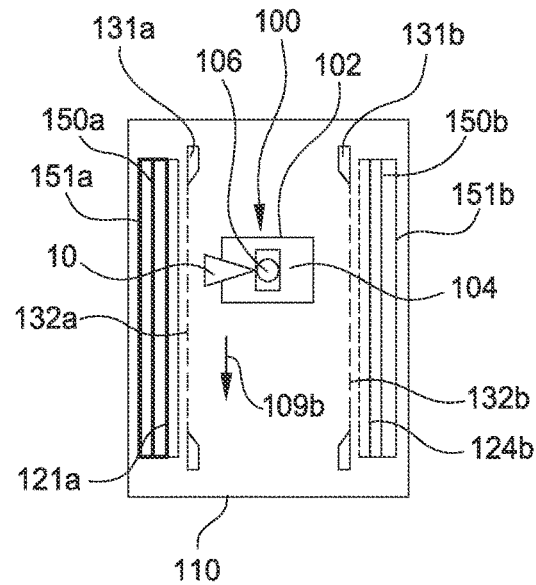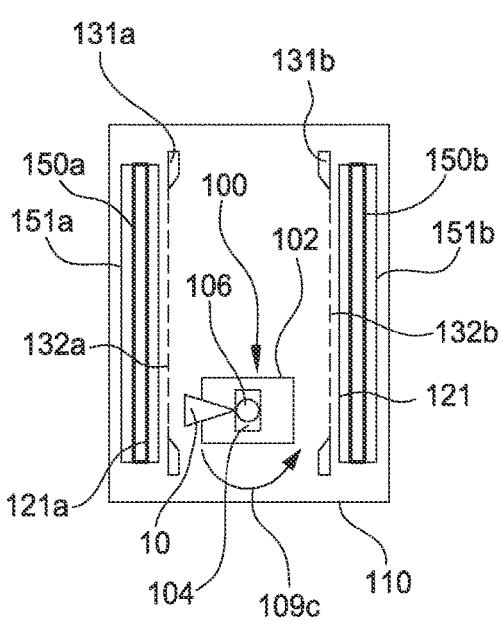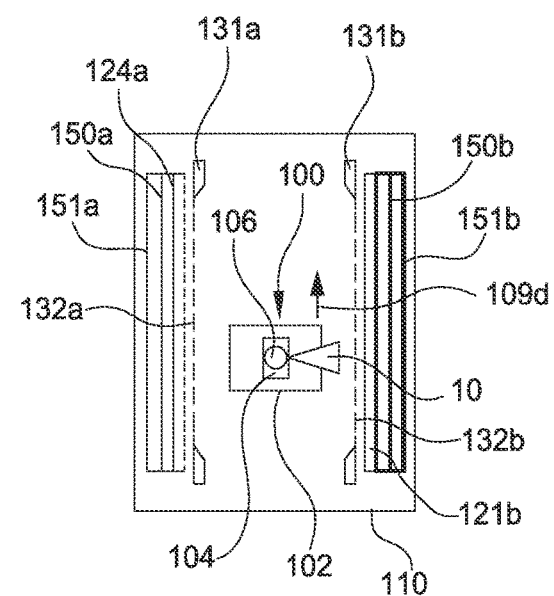
FIG. 1A   FIG. 1B
FIG. 1C   FIG. 1D

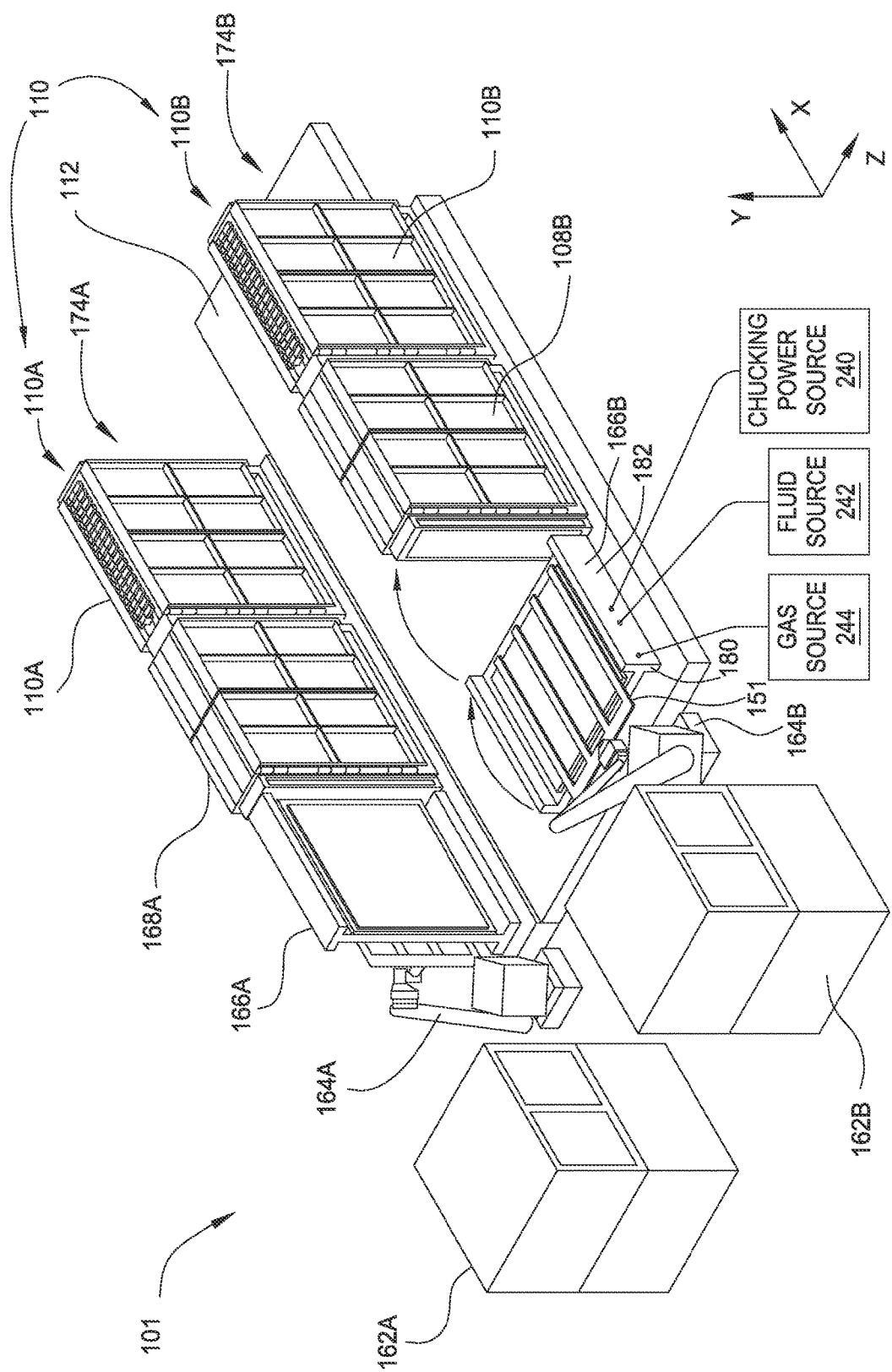

SUBSTRATE CARRIER WITH INTEGRATED ELECTROSTATIC CHUCK

BACKGROUND OF THE INVENTION

Field of the Invention

Embodiments of the present invention generally relate to a substrate carrier, and more particularly, a substrate carrier with integrated electrostatic chuck suitable for use in a vertical and other processing systems.

Description of the Related Art

Plasma display panels, organic light emitting diodes (OLED) displays and liquid crystal displays are frequently used for flat panel displays. Liquid crystal displays (LCD) generally contain two glass substrates joined together with a layer of a liquid crystal material sandwiched therebetween. The glass substrate may be a semiconductor substrate, or may be a transparent substrate such as a glass, quartz, sapphire, or a clear plastic film. The LCD may also contain light emitting diodes for back lighting.

During manufacturing of flat panel displays or solar panels, plasma processes for depositing material layers on the glass or transparent substrate may be repeatedly performed to form structures comprising the flat panel displays or solar panels. Some processing systems hold the substrate in a vertical orientation during processing. During processing of the substrate in a vertical orientation, it is often difficult to control the mask portion of the substrate. Often the mask is clamped a single time to the substrate and that alignment is thus maintained throughout the entire deposition process. Expansion or repositioning of the mask cannot be accommodated.

Furthermore, the substrates processed in a vertical orientation are often held on a substrate carrier using mechanical clamping force. Conventional mechanical clamping carriers used to hold a substrate during transfer and sometimes processing may often result in substrate damage due to the high mechanical clamping force. In addition, the conventional mechanical clamping carriers generally hold the substrate at the edges, thus resulting in a highly concentrated physical contact with the edges of the substrate so as to ensure sufficient clamping force applied to securely pick up the substrate. This mechanical contact concentrated at the edges of the substrate inevitably creates contact contamination or physical damage, undesirably polluting the substrate. Particularly, for substrates used for smart phones, plasma display panels, LED or solar cell applications, thin substrates are often utilized, thus increasing the difficulty in transferring the substrates without damage.

In conventional plasma processing applications, the temperature within the chamber may be controlled at different ranges. Some applications with organic materials formed on a glass substrate, the temperature controlled in a plasma process is typically below 250 degrees Celsius. In a vertical processing system, temperature control for the substrate carrier during plasma processing has become challenging as poor control of the temperature to the substrate carrier may not only result in material deposition failure, but also affect the chucking ability to the substrate disposed thereon, inevitably leading to inconsistent or undesirable electrical properties of the substrate carrier which adversely affects the carrier's ability to hold substrates. Thus, it would be desirable to have a substrate carrier having enhanced heat resistance and temperature control as well as the capability to chuck thin substrates during processing.

There is a need for a method and apparatus for transferring substrates in a processing system suitable for maintaining the substrate in a vertical orientation while effectively interfacing with a mask.

SUMMARY OF THE INVENTION

A substrate carrier adapted for use in a processing system includes an electrode assembly and a support base. The electrode assembly is configured to generate an electrostatic chucking force for securing a substrate to the substrate carrier. The support base has a heating/cooling reservoir formed therein. The electrode assembly and the support base form an unitary body configured for transport within the processing system. A connector is coupled to the body and configured to transfer of a heat regulating medium to enter the reservoir heating/cooling reservoir.

In another embodiment, a processing system is provided that includes a substrate carrier, a loading station and a processing chamber. The substrate carrier includes an electrode assembly configured to generate an electrostatic chucking force and a support base having a heating/cooling reservoir formed therein. The electrode assembly and support base form an unitary body that is configured for transport within the processing system. The substrate carrier also includes a quick disconnect coupled to the body. The quick disconnect is configured to trap a heat regulating medium in the reservoir heating/cooling reservoir when the body is decoupled from a source of heat regulating medium. The loading station is adapted to connect a power source and the source of heat regulating medium to the carrier. The processing chamber is adapted to receive the carrier with the substrate electrostatically coupled thereon.

In yet another embodiment, a method for transporting a substrate in a processing system is provided that includes transferring a substrate onto a substrate carrier disposed in a substrate loading station, electrostatically chucking the substrate to the substrate carrier, and transferring the substrate while electrostatically chucked to the substrate carrier in a substantially vertical orientation from the substrate loading station to a processing chamber.

In yet another embodiment, a substrate carrier adapted to use in a processing system, the substrate carrier includes a support base, an electrode assembly having interleaved electrode fingers formed therein disposed on the support base, and a connector coupled to the support base configured to electrically disconnect a power source to the electrode assembly, the support base and the electrode assembly comprising a unitary body adapted to be transported within a processing system.

Methods for processing a substrate while disposed on a carrier having independently addressable electrode assemblies are also provided. In one example, a method for processing a substrate is provided that includes chucking a substrate to a carrier utilizing a plurality of independently controllable electrode assemblies operating in a first chucking mode, transferring the chucked substrate into a processing chamber, and selectively changing at least one of the electrode assemblies from the first chucking mode to a second chucking mode while at least one of the electrode assemblies remains operating in the first chucking mode.

In another example, a method for processing a substrate is provided that includes selectively providing a first chucking power from an on-board power source controlled by an on-board controller to a plurality of electrode assemblies of a transportable carrier, transferring the chucked substrate into a processing chamber, and selectively providing a second chucking power from the on-board power source to at least one of the electrode assemblies while at least one of the electrode assemblies is still provided with the first chucking power.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

FIGS. 1A to 1D show schematic views illustrating a processing system in use with a substrate retained on a substrate carrier having an integrated electrostatic chuck;

FIG. 1E is a schematic representation of a processing system having a substrate carrier with integrated electrostatic chuck according to another embodiment;

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Figure 2:
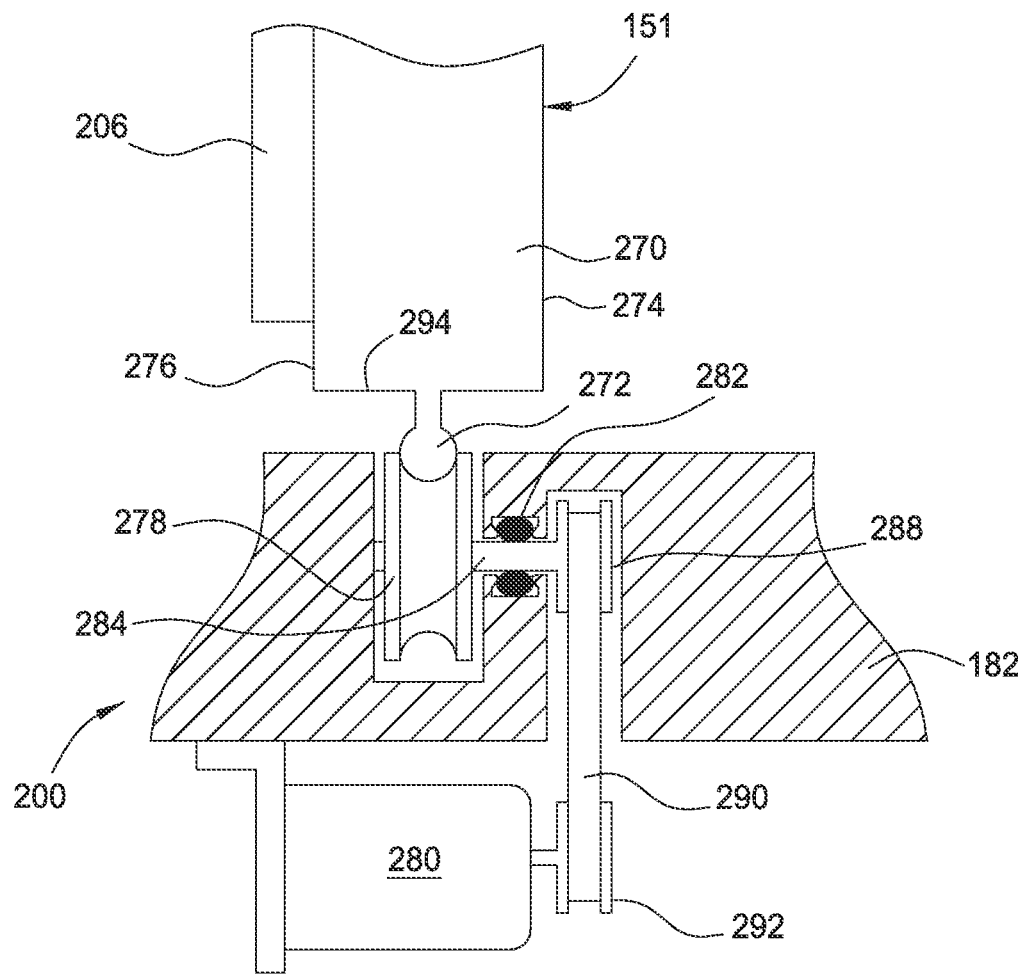
FIG. 2 is a partial sectional view of a drive system utilized to move the substrate carrier within a processing system.

The present invention generally relates to a substrate carrier suitable for maintaining a substrate in a vertical orientation during processing and methods for using the same. The substrate carrier includes an integrated electrostatic chuck. The substrate carrier may also be temperature controllable so as to control a temperature of the substrate disposed thereon within a desired temperature range.

The embodiments discussed herein may be practiced utilizing a vertical deposition system, for example a vertical CVD or vertical PVD chamber, such as a modified AKT New Aristo™ Twin PVD system available from Applied Materials, Inc., Santa Clara, Calif. It is to be understood that the embodiments of the invention may be practiced in other processing systems as well, including non-inline (i.e., cluster) systems and including systems sold by other manufacturers. It should also be noted that although the substrate carrier described herein is particularly beneficial for use in vertical processing systems, the substrate carrier is equally adapted for processing systems that retain the substrate in a non-vertical, such as a horizontal orientation.

FIGS. 1A to 1D illustrates a processing chamber 110 having an evaporation source 100 in various positions with respect to masks 132, e.g., a first mask 132a and a second mask 132b utilized to control the deposition onto substrates 206 being proceed within the chamber 110. The movement of the evaporation source 100 between the different positions is indicated by arrows 109B, 109C, and 109D. FIGS. 1A to 1D show the evaporation source 100 having an evaporation crucible 104 and a distribution pipe 106. A nozzle 10 extends from the pipe 106 to direct material onto the substrate 206. The distribution pipe 106 is supported by the support 102. Further, according to some embodiments, the evaporation crucible 104 can also be supported by the support 102. In operation, substrates 206, e.g. a first substrate 121a and a second substrate 121b, are provided in the processing chamber 110. The first substrate 121a and the second substrate 121b are supported and chucked to a respective substrate carrier 151, e.g. a first substrate carrier 151a and a second substrate carrier 151b, described in more detail with reference to FIGS. 2-3A below. The first mask 132a and second mask 132b are provided between the substrates 121a, 121b and the evaporation source 100. The first mask 132a and second mask 132b are chucked by a respective mask chucking assembly, for example, an electrostatic chuck 150, e.g. a first electrostatic chuck 150a and a second electrostatic chuck 150b, which are integrated into the substrate carrier 151. As illustrated in FIGS. 1A to 1D, organic material is evaporated from the distribution pipe 106 to deposit a layer on the substrates 121a and 121b. The first mask 132a and the second mask 132b mask portions of the substrate during the layer deposition.

In FIG. 1A, the evaporation source 100 is shown in the first position with the first substrate carrier 151a and the second substrate carrier 151b being active. As shown in FIG. 1B, the first integrated electrostatic chuck 150a has the first substrate 121a chucked in position. The first mask 132a, shown positioned over the first substrate 121a, is chucked into position by the first integrated electrostatic chuck 150a over the appropriate portion of the first substrate 121a. With the first mask 132a in position, the first substrate 121a in the processing chamber 110 is deposited with a layer of material, for example, an organic material, by a translational movement of the evaporation source as indicated by arrow 109B. While the first substrate 121a is deposited with the layer of organic material through the first mask 132a, a second substrate 121b, e.g. the substrate on the right-hand side in FIGS. 1A to 1D, can be exchanged. FIG. 1B shows a second transportation track 124b for the second substrate 121b. As the second substrate 121b is not in position in FIG.

1B, the second substrate 151b and the second integrated electrostatic chuck 150b are not activated for chucking. After the first substrate 121a has been deposited with the layer of organic material, the nozzle 10 of the distribution pipe 106 of the evaporation source 100 is rotated as indicated by arrow 109C in FIG. 1C to point the nozzle 10 at the second substrate 121b.

During deposition of the organic material on the first substrate 121a, the second substrate 121b is then chucked to the second substrate carrier 151b. The second mask 132b is the positioned and aligned with relation to the second substrate followed by chucking the second mask 132b to the second integrated electrostatic chuck 150b over the second substrate 121b. Accordingly, after the rotation shown in FIG. 1C, the second substrate 121b can be coated with a layer of organic material through the second mask 132b as the pipe 106 and the nozzle 10 are translated across the substrate 121b, as indicated by arrow 109D. While the second substrate 121b is coated with the organic material, the first mask 132a can be unchucked from the first integrated electrostatic chuck 150a. With the first mask 132a being unchucked, the first substrate 121a can then be removed from the chamber 110 for unchucking from the first integrated electrostatic chuck 150a. FIG. 1D shows a first transportation track 124a in the position of the first substrate 121a.

According to embodiments described herein, the first substrate 121a and second substrate 121b are coated with organic material in a substantially vertical position. That is, the views shown in FIGS. 1A to 1D are top views of an apparatus including the evaporation source 100. The distribution pipe can be a vapor distribution showerhead, particularly a linear vapor distribution showerhead. Thereby, the distribution pipe provides a line source extending essentially vertically. According to embodiments described herein, which can be combined with other embodiments described herein, essentially vertically is understood particularly when referring to the substrate orientation, to allow for a deviation from the vertical direction of 10° or less. This deviation can be provided because a substrate carrier with some deviation from the vertical orientation might result in a more stable substrate position. Yet, the substrate orientation during deposition of the organic material is considered essentially vertical, which is considered different from the horizontal substrate orientation. The surface of the substrates is thereby coated by a line source extending in one direction corresponding to one substrate dimension and a translational movement along the other direction corresponding to the other substrate dimension. Moreover, though described in reference to a vertical position for an exemplary vertical process chamber, this configuration and/or chamber is not intended to be limiting. Embodiments described herein are equally amenable to horizontal chambers or chambers which can process more or fewer substrates.

Some examples described herein particularly relate to deposition of organic materials, e.g. for OLED display manufacturing and on large area substrates. Other examples may be utilized to deposit non-organic materials, such as $SiO_2$, SiO, SiON and others. According to some embodiments, large area substrates or carriers supporting one or more substrates, i.e. large area carriers, may have a size of at least 0.174 m$^2$. The size of the carrier can be about 1.4 m$^2$ to about 8 m2, such as about 2 m$^2$ to about 9 m$^2$ or even up to 12 m$^2$. The substrate may be made from any material suitable for material deposition. For instance, the substrate may be made from a material selected from the group consisting of glass (for instance soda-lime glass, borosilicate glass etc.), metal, polymer, ceramic, compound materials, carbon fiber materials or any other material or combination of materials which can be coated by a deposition process.

According to one example described herein, the first integrated electrostatic chuck 150a and the second integrated electrostatic chuck 150b can be integrated into the process chamber or with the substrate carrier 151. Embodiments which can be integrated with the substrate carrier 151 include the embodiments described with reference to FIGS. 2 and 3A-3B.

FIG. 1E is a schematic representation of a vertical, linear processing system 101 according to one embodiment, which is configured to utilize a substrate carrier 151 (shown as 151a, 151b in FIGS. 1A-1D) having the integrated electrostatic chuck 150 (shown as 150a, 150b in FIGS. 1A-1D). The processing system 101 may be configured for deposition, etch, implantation, annealing or other vacuum process. The system 101 may be sized to process substrates having a surface area of greater than about 90,000 mm$^2$ and, in some embodiments, be able to process more than 90 substrates per hour when depositing a 2,000 Angstrom thick material layer. The system 101 includes two separate process lines 174A, 174B coupled together by a common system control platform 162 to form a twin process line configuration/layout. A common power supply (such as an AC power supply), common and/or shared pumping and exhaust components and a common gas panel may be used for the twin process lines 174A, 174B. Each process line 174A, 174B may process more than 45 substrates per hour for a system total of greater than 90 substrates per hour. It is also contemplated that the system may be configured using a single process line or more than two process lines, and additionally that the system may be configured to process substrates of different sizes.

There are several benefits to the twin processing lines 174A, 174B for vertical substrate processing. Because the chambers of the processing system 101 are arranged vertically, the footprint of the system 101 is about the same as a single, conventional horizontal processing line. Thus, within approximately the same footprint, two processing lines 174A, 174B are present, which is beneficial to the manufacturer in conserving floor space in the fab. To help understand the meaning of the term "vertical", considering a flat panel display, the flat panel display, such as a computer monitor, has a length, a width and a thickness. When the flat panel display is vertical, either the length or width extends perpendicular from the ground plane while the thickness is parallel to the ground plane. Conversely, when a flat panel display is horizontal, both the length and width are parallel to the ground plane while the thickness is perpendicular to the ground plane. For large area substrates, the length and width are many times greater than the thickness of the substrate.

Each processing line 174A, 174B includes a substrate stacking module 162A, 162B from which fresh substrates (i.e., substrates which have not yet been processed within the system 101) are retrieved and processed substrates are stored. Atmospheric robots 164A, 164B retrieve substrates from the substrate stacking modules 162A, 162B and place the substrates into a dual substrate loading station 166A, 166B. It is to be understood that while the substrate stacking module 162A, 162B is shown having substrates stacked in a horizontal orientation, substrates disposed in the substrate stacking module 162A, 162B may be maintained in a vertical orientation similar to how the substrates are held in the dual substrate loading station 166A, 166B. The fresh substrates are then moved into dual substrate load lock chambers 168A, 168B and then to a dual substrate processing chamber 110 (shown as 110A, 110B in FIG. 1E and 110 in FIGS. 1A-1D). The substrate, now processed, then returns through one of the dual substrate load lock chambers 168A, 168B to one of the dual substrate loading stations 166A, 166B, where it is retrieved by one of the atmospheric robot 164A, 164B and returned to one of the substrate stacking modules 162A, 162B.

The sequence will be discussed in reference to both processing lines 174A, 174B at the same time even though a substrate goes down only one line. Each robot 164A, 164B may access both substrate loading stations 166A, 166B simultaneously or individually to pick up substrates. The robots 164A, 164B load substrates onto the substrate carrier 151 disposed on a support surface. In the embodiment of FIG. 1E, the support surface is in the form of a flip table 180. The flip table 180 is configured to rotate the substrate carrier 151 approximately 90 degrees, for example, between a substantially horizontal and a substantially vertical orientation. The flip table 180 may include a flange 182 to retain the substrate carrier 151 when in the vertical position, and to allow connection between utilities and the substrate carrier 151 as further described below. The carrier 151 are disposed in the loading stations 166A, 166B and are configured to transfer substrates from the substrate stacking modules 162A, 162B to the load lock chamber 168A, 168B, and then to the processing chambers 110A, 110B. A gas source 244, fluid source 242 and a chucking power source 240 are configured to interface with the substrate carrier 151 at least while the substrate carrier 151 is located in one or more of the substrate loading stations 166A, 166B, load lock chambers 168A, 168B, or processing chambers 110A, 110B. More specifically, the substrate carrier 151 may temporarily coupled to one or more of the gas source 244, fluid source 242 and the chucking power source 240 so that an electrostatic chucking force for chucking the substrate to the substrate carrier 151 and temperature of the substrate carrier 151 may be regulated. Alternatively, the chucking power source 240 may be in the form of an energy storage device (shown as 440 in FIG. 3A), such as a battery, capacitor or other devices, disposed within the substrate carrier 151 so that the chucking force may be controlled over the entire period that the substrate is secured to the substrate carrier. Details regarding how the electrostatic chucking force and temperature of the substrate carrier 151 is controlled will be discussed further below with the reference to FIGS. 5A-5B.

During operation, the substrate carriers 151 are disposed in the loading stations 166A, 166B in a substantially horizontal or vertical orientation to receive substrates from the substrate stacking modules 162A, 162B. In the embodiment depicted in FIG. 1E, the loading station 166A is shown in a substantially vertical orientation to receive a substrate that has been processed while on the substrate carrier 151 in the processing chamber 110A which is returning to the substrate stacking module 162A, while the loading station 166B is shown in horizontal orientation holding the substrate carrier 151 to receive a substrate to be processed in the processing chamber 110A from the substrate stacking modules 162B. While in at least the substantially vertical orientation and optionally also the horizontal orientation, the substrate carriers 151 are coupled to the gas source 244, the fluid source 242 and the chucking power source 240 so that the temperature of the substrate carriers 151 may be set to a predefined value and the substrate may be chucked to the substrate carrier 151. In the embodiment with the loading station 166B with the horizontal orientation, after the gas source 244, fluid source 242 and the chucking power source 240 are decoupled from the substrate carrier 151, the substrate carrier 151 may then be rotated about 90 degrees to transfer the substrate carrier 151 into the load lock chamber 168B in a substantially vertical orientation. For example, the gas source 244, fluid source 242 and the chucking power source 240 may alternatively disengage from the substrate carriers 151 prior to, during, or after the substrate carriers 151 are rotated to the substantially vertical orientation.

It is noted that the gas source 244, fluid source 242 and the chucking power source 240 may also be connected to the substrate carrier 151 while the substrate carrier 151 is located in one or more of the processing chambers 110A, 110B or in the load lock chambers 168A, 168B prior to, during, or after the substrate is processed, to facilitate proving gas, fluid and power to the substrate carrier 151 as needed.

The substantially vertical substrate carriers 151 each having a substrate electrostatically chuck thereto, are transferred into the dual substrate load lock chambers 168A, 168B to be readied for transfer to the dual substrate processing chambers 110A, 110B for processing. The processing chambers 110A, 110B may be a chemical vapor deposition chamber, a physical vapor deposition chamber, an etch chamber, a plasma treatment chamber, an implantation chamber, an annealing chamber or other workpiece (i.e., substrate) processing chamber. After processing, the substrates disposed on the carriers 151 are then transferred back to the load lock chambers 168A, 108B, to the loading stations 166A, 166B. Once the processed substrates are loaded onto the loading stations 166A, 166B, the substrate carriers 151 are rotated to a substantially horizontal orientation to facilitate removal of the processed substrates therefrom and transfer of the processed substrates back to the substrate stacking modules 162A, 162B.

FIG. 2 is a partial sectional view of a drive system 200 of the substrate carrier 151 used to move a substrate 206 from the loading stations 166A, 166B to the load lock chambers 168A, 168B and/or the processing chambers 110A, 110B. In the embodiment of FIG. 2, the drive system 200 is illustrated in the flange 182 of the flip table 180. Although not shown for the sake of brevity, the load lock chambers 168A, 168B and the processing chambers 110A, 110B also have drive systems 200 disposed therein for moving the substrate carrier 151 within the system 101.

The substrate carrier 151 includes a body 270 having a substrate supporting surface 276, a bottom surface 274 and sides 294. The substrate supporting surface 276 is configure to have the substrate 206 electrostatically chucked thereto, while the bottom surface 274 is on the opposite side of the carrier 151 relative to the substrate supporting surface 276. The sides 294 connect the substrate supporting surface 276 and bottom surface 274, and generally define the thickness of the substrate carrier 151. The substrate supporting surface 276, and thus the body 270, may have a generally polygonal shape, such as a rectangular shape. However, it is contemplated that the body 270 may alternatively have another shape, such as circular.

A guide rail 272 extends from the side 294 of the body 270. The guide rail 272 may have an orientation substantially perpendicular to a plane of the substrate supporting surface 276. The guide rail 272 is configured to interface with a transfer mechanism of the drive system 200. In one embodiment, the transfer mechanism is a roller 278 having a concave sheave that receives the guide rail 272.

The drive system 200 includes a motor 280 for actuating the roller 278, which thus controls the motion of the substrate carrier 151 within the system 101. In one embodiment, the motor 280 is coupled to a sheave or gear 292 which drives a belt 290. The belt 290 is interfaced with a sheave or gear 288. The gear 288 is coupled to a shaft 284 which is coupled to the roller 278 that engages the rail 272 of the substrate carrier 151. The shaft 284 passes through the flange 182 of the table 180 (and bottom wall of the chambers 108A, 108B, 110A and 110B for drive systems 200 in those regions). A seal 282 engages the shaft 284 to prevent leakage, such as vacuum leakage, between the regions of the shaft 284 coupled to the gear 288 and roller 278.

Figure 3A:
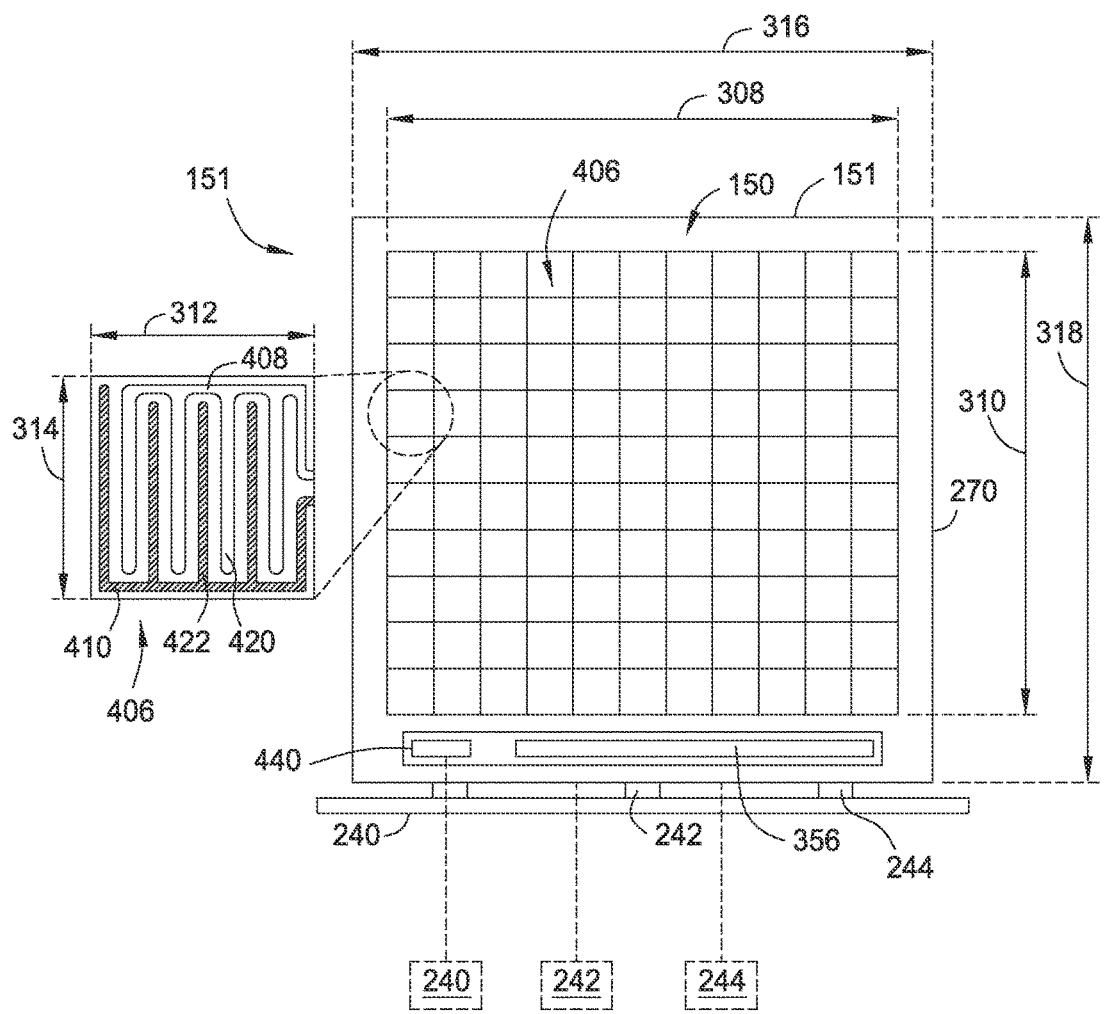
FIG. 3A is front view of a substrate carrier.

FIG. 3A illustrates a front view of the substrate carrier 151 of FIG. 1A-1E in vertical orientation. The electrostatic chuck 150 of the substrate carrier 151 includes an array of electrode assemblies 406. The electrode assemblies 406 may be independently controllable, independtable replaceable and fixable. Each electrode assembly 406 of the integrated electrostatic chuck 150 includes at least two sets of distributed electrodes 408, 410. The electrodes 408, 410 may be arranged in any desired configuration such that the electrodes 408, 410 may be energized to create an electrostatic force sufficient to secure the substrate to the substrate supporting surface 276 of the substrate carrier 151. The different sets of electrodes 408, 410 can be equally spaced apart, or arranged in any other desired configuration. For example, the sets of electrodes 408, 410 may be arranged in columns, rows, arrays, or other patterns configured to provide desired chucking characteristics. Details regarding the arrangement of the electrodes 408, 410 will be further discussed below with reference to FIG. 4A. Each electrode 408, 410 may be charged with different voltages or polarities as needed, thus generating an electrostatic force. The multiple sets of electrodes 408, 410 may be configured to laterally distribute the electrostatic force across the substrate supporting surface 276 of the ceramic chuck body 270.

The first electrode 408 may include a plurality of electrode fingers 420 that are interleaved with a plurality of electrode fingers 422 of the second electrode 410. It is believed that the electrode interleaved fingers 420, 422 provide local electrostatic attraction distributed across a large area of the integrated electrostatic chuck 150 in which the aggregation provides a high chucking force while utilizing less chucking voltage. The electrode fingers 420, 422 may be formed to have different lengths and geometry. In one embodiment, the electrode fingers 420, 422 may have a width of between about 0.1 mm and about 20 mm, for example about 0.25 mm to about 10 mm, which may vary depending upon the material type to be chucked. If desired, electrode fingers 420, 422 may be configured with different sizes interleaving to each other. The electrode fingers 420, 422 may be alternatively and repeatedly formed until desired numbers of the electrode fingers 420, 422 are formed.

Each of the electrode assemblies 406 of the integrated electrostatic chuck 150 may be individually controllable to enable fine tuning of the chucking force provided within a desired region of the integrated electrostatic chuck 150. Similarly, groups of electrode assembly 406, for example may be controllable together. It is contemplated that any number of electrode assembly 406 may be controllable together in any desired pattern or combination. The individual or group control of the electrode assembly 406 within the integrated electrostatic chuck 150 may be controlled by control electronics 356 and may be adapted to chuck various types of substrates to the carrier 151. The control electronics 356 may be on-board, that is contained on, the substrate carrier 151.

The power source 240 may also be electrically coupled to the electrodes 408, 410 of the electrode assembly 406 and configured to provide chucking or de-chucking power to the electrode assembly 406 when desired. The power source 240 may also be in electrical communication with the control electronics 356. As such, the control electronics 356 may be adapted to control the delivery of electrical signals from the power source 240 independently to the each of the electrode assemblies 406.

The integrated electrostatic chuck 150 may comprise between about 5 and about 500 electrode assemblies 406, for example, between about 200 and about 300 electrode assemblies 406. In one embodiment, the integrated electrostatic chuck 150 has about 225 electrode assemblies 406. In another embodiment, the integrated electrostatic chuck 150 has about 75 groups of three electrode assemblies 406. Although shown as arranged in a grid-like pattern, the arrays of electrode assembly 406 may be configured in any shape or pattern on the body 270 to accommodate desired chucking capabilities.

The electrode assemblies 406 included in the integrated electrostatic chuck 150 are depicted as having a square or rectangular shape, however, it is contemplated that any shape of electrode assembly 406 may be utilized to form the integrated electrostatic chuck 150. In one embodiment, a width 312 of each electrode assembly 406 may be between about 100 mm and about 200 mm, such as between about 150 mm and about 175 mm. A length 314 of each electrode assembly 406 may be between about 100 mm and about 200 mm, such as between about 140 mm and about 150 mm. The length 314 and width 312 may also have other sizes.

An area occupied by the integrated electrostatic chuck 150 may correlate to a size of the body 270 and may cover the entire body 270 or only a portion of the body 270. As depicted, the integrated electrostatic chuck 150 covers a portion of the carrier body 270. In one embodiment, a width 308 of the integrated electrostatic chuck 150 may be between about 1000 mm about 3000 mm, such as between about 2000 mm and about 2500 mm. A length 310 of the integrated electrostatic chuck 150 may be between about 1000 mm about 3000 mm, such as between about 2000 mm and about 2500 mm. However, as previously mentioned, the size of the integrated electrostatic chuck 150 will generally correspond to the size of the body 270 and the size of the substrate intended for use with the substrate carrier 151.

As previously described, the body 270, which has the integrated electrostatic chuck 150 disposed thereon, may have the control electronics 356, power source 240, gas source 244 and fluid source 242 coupled thereto. The carrier body 270 may be fabricated from a metal, such as aluminum, titanium, stainless steel, and alloys and combinations thereof. The carrier body 270 may be square shaped or rectangular shaped, however, it is contemplated that the carrier body 270 may have other shapes.

The energy storage device 440, such as a battery, capacitor or the like, may be coupled to or disposed in the carrier body 270 and be configured to store and provide power to the integrated electrostatic chuck 150. In one embodiment, the energy storage device 440 and the control electronics 356 are coupled to the carrier body 270 adjacent the integrated electrostatic chuck 150. In another embodiment, the energy storage device 440 may be located remotely from the carrier body 270 but in electrical communication with the integrated electrostatic chuck 150 and the control electronics 356. For example, the energy storage device 440 may be located within a processing chamber and may be electrically coupled to the integrated electrostatic chuck 150 and control electronics 356 when it is desirable to chuck and de-chuck a substrate from the substrate carrier 151. The energy storage device 440 may be recharged by temporarily connecting to the chucking power source 240 or through inductive charging from inductive power sources positioned in various places inside the system 101.

In operation, one or more substrates may be placed in contact with the substrate carrier 151 and the control electronics 356 may cause the energy storage device 440 to provide a first chucking voltage to one or more electrode assembly 406 disposed within integrated electrostatic chuck 150. The integrated electrostatic chuck 150 chucks the substrate for a desired amount of time (i.e. during processing) and the control electronics 356 may then cause the energy storage device 440 to provide a second chucking voltage to de-chuck the substrate from the substrate carrier 151. In one embodiment, sensors disposed within (or adjacent to) the processing chamber may be in communication with the control electronics 356 and provide signals to the control electronics 356 when it is desirable to chuck and/or de-chuck the substrate. Although the power source 240 and the control electronics 356 are shown as being coupled to the carrier body 270 below the integrated electrostatic chuck 150, it is contemplated that the energy storage device 440 and the control electronics 356 may be coupled to or disposed in the carrier body 270 at any desirable location, for example, above the integrated electrostatic chuck 150 or beside the integrated electrostatic chuck 150.

Figure 3B:
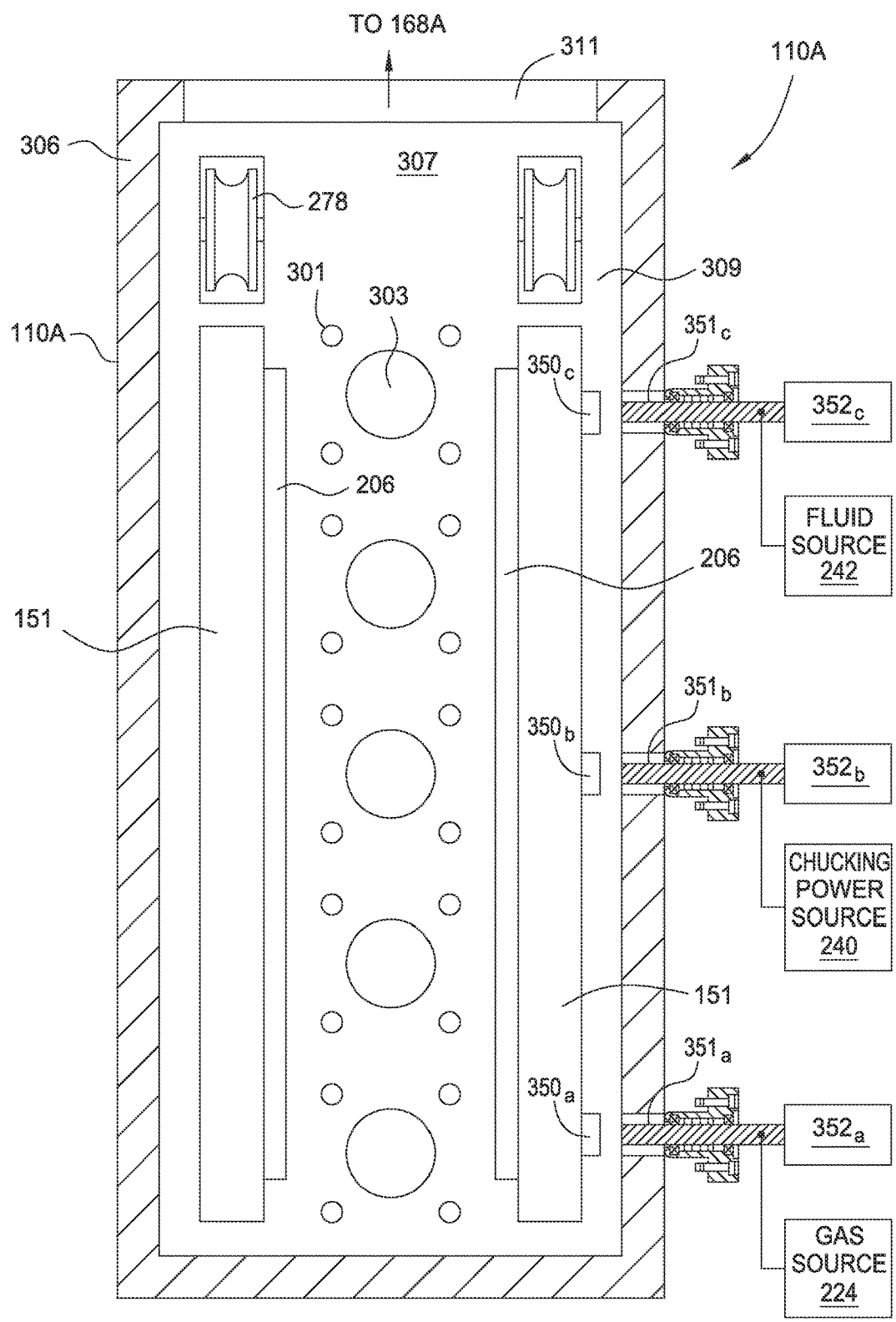
FIG. 3B is schematic top sectional view one embodiment of a processing chamber having the substrate carrier disposed therein.

FIG. 3B depicts one embodiment of the processing chamber 110A.

The processing chamber 110B is similarly constructed. The processing chamber 110A includes a chamber body 305 having a bottom 309 in which the drive systems 200 for moving the substrate carrier 151 are disposed. Although only one drive systems 200 is shown for each carrier 151 illustrated in FIG. 3B, a plurality of drive systems 200 (not shown) are located below the carriers 151. The chamber body 305 includes a sealable slit valve passage 311 through which the carriers 151 pass when transferring the substrate 206 between the load lock chamber 168A and processing chamber 110A.

The chamber body 305 encloses an internal volume 307 having a plurality of gas sources 301 and plasma generators 303 disposed therein. The gas sources 301 are coupled to a gas panel (not shown) for providing processing gases to the internal volume 307. Examples of processing gases include gases suitable for the deposition of a film on the substrate 206 comprising at least one of SiN, SiO, and SiON, among others. The plasma generators 303 may be a microwave source or other device suitable for energizing the processing gases within the internal volume 307 such that a plasma may be sustained. In one embodiment, the gas sources 301 are disposed between the plasma generators 303 and substrates 206 retained on the carrier 151.

In order to process a substrate in the system 101, the substrate 206 is first retrieved from a substrate stacking module 162A, 162B by an atmospheric robot 164A, 164B and placed into the dual substrate loading station 166A, 166B. In one embodiment, the substrate 206 may be placed on the substrate carrier 151 in a dual substrate loading station 166A, 166B. Once the substrate 206 is loaded in the dual substrate loading station 166A, 166B, the substrate carrier 151 is then connected to the gas source 244, fluid source 242 and the chucking power source 240. Subsequently, a chucking power may be supplied to the carrier 151 from the chucking power source 240 to chuck the substrate 206 securely onto the substrate carrier 151. Furthermore, cooling or heating fluid (e.g., temperature regulating medium) may optionally be supplied to the substrate carrier 151 from the fluid source 242 to control temperature of the substrate 206 disposed on the substrate carrier 151. Furthermore, gas at the interface between the substrate 206 and substrate carrier 151 may optionally be pumped down to provide a good sealing surface at the interface. In one embodiment, in order to ensure the substrate 206 may be securely and constantly chucked on the substrate carrier 151 without falling from the substrate carrier 151 during processing, the energy storage device 440 may optionally be incorporated with the substrate carrier 151 so as to continuously supplying chucking power during substrate transport and processing on the substrate carrier 151.

Connection between the gas source 244, fluid source 242 and the chucking power source 240 and the substrate carrier 151 may be made in any suitable manner, for example, using plug and socket connectors, blade connectors, screw terminals, quick disconnects, banana connectors and the like. In one embodiment, the substrate carrier 151 includes connectors 350a, 350b, 350c which releasably interconnect with mating connectors 351a, 351b, 351c to respectively couple each of the gas source 244, fluid source 242 and the chucking power source 240 with the substrate carrier 151. The mating connectors 351a, 351b, 351c are coupled to actuators 352a, 352b, 352c which move the mating connectors 351a, 351b, 351c between a first state connected with the connectors 350a, 350b, 350c and a second state disconnected and clear from the connectors 350a, 350b, 350c to facilitate movement of the substrate carrier 151. One or both of the connectors 350a, 350c coupling to the gas and fluid sources 244, 242 may optionally include internal check or isolation valves to prevent flow through the connectors 350a, 350c when decoupled from the mating connectors 351a, 351c. The other areas of the processing system may couple and decouple the gas source 244, fluid source 242 and the chucking power source 240 with the substrate carrier 151 utilizing the same or similar devices.

After the substrate 206 is securely chucked on the substrate carrier 151 and at a desired temperature, the gas source 244, fluid source 242 and the chucking power source 240 may then be disconnected from the substrate carrier 151 to allow transfer the substrate 206 still electrostatically chucked to the carrier 151 for further processing in the processing chambers of the system 101. A slit valve door opens and the substrate 206 disposed on the substrate carrier 151 is transported into the load lock chamber 168A, 168B. The load lock chamber 168A, 168B is then evacuated to approximately the vacuum level of the adjacent processing chamber 110A, 110B. A slit valve door is then opened and the substrate 206 disposed on the substrate carrier 151 is transported into a processing chamber 110A, 110B. After processing, the sequence is reversed to remove the substrate 206 from the system 101.

Figure 4A:
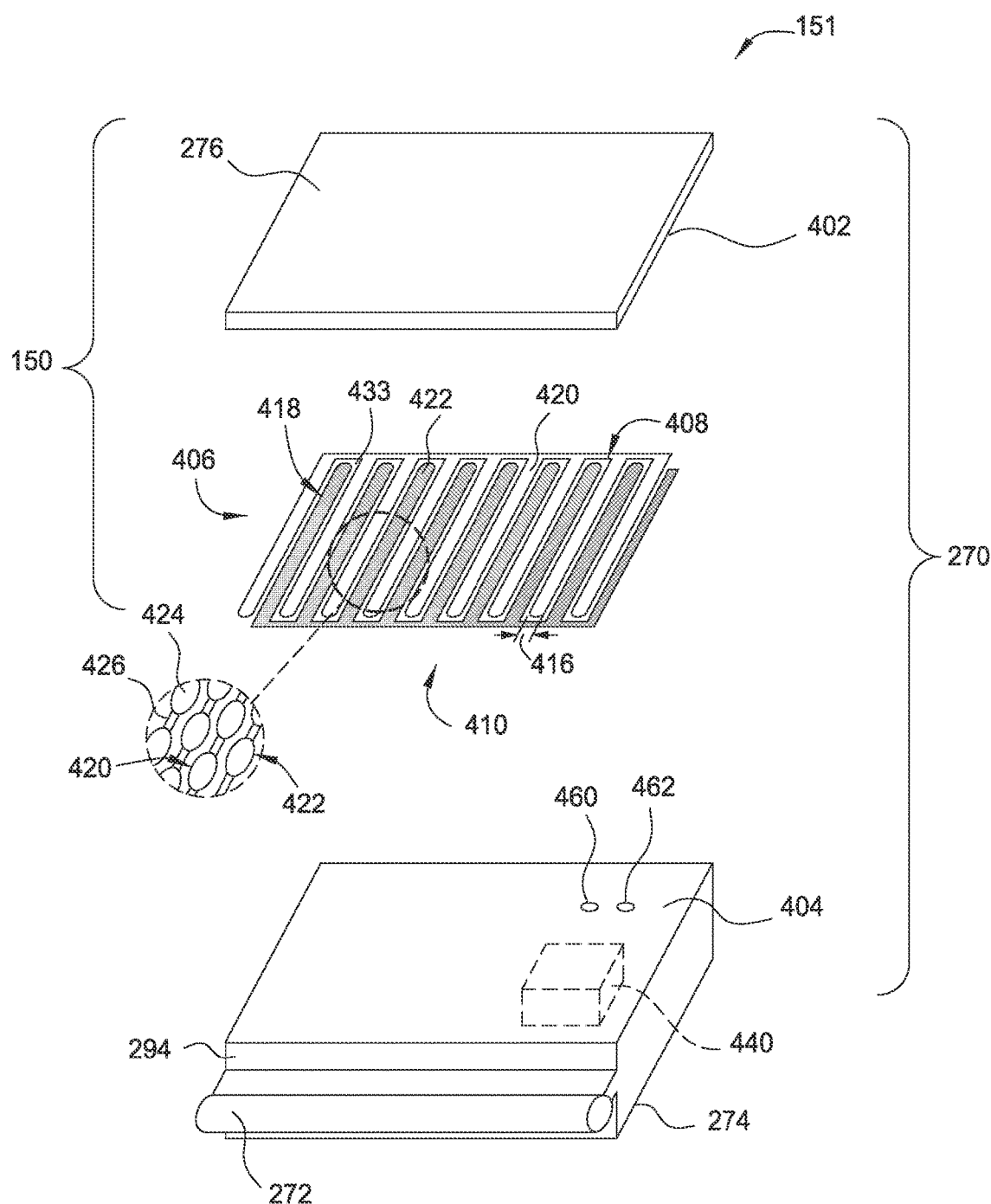
FIG. 4A depicts an exploded view of one embodiment of a substrate support plate with integrated electrostatic chuck of a substrate carrier according to some embodiments.

FIG. 4A depicts an exploded view of one embodiment of the substrate carrier 151. The substrate carrier 151 includes the integrated electrostatic chuck 150 disposed on a rigid support base 404. The integrated electrostatic chuck 150 includes the electrode assembly 406, as discussed above with reference to FIG. 3A, and an encapsulating member 402 disposed on the electrode assembly 406. The integrated electrostatic chuck 150 and the rigid support base 404 together form the body 270 of the substrate carrier 151. The rigid support base 404 defines the bottom surface 274 of the substrate carrier 151 while the encapsulating member 402 defines the substrate supporting surface 276 of the substrate carrier 151. Although not shown, the body 270 may include lift pin holes extending therethrough.

In the embodiment of FIG. 4A, the rigid support base 404 has a rectangular-like shape having a periphery (defined by the sides 294) that substantially matches the shape and size of electrode assembly 406 and encapsulating member 402 to allow the substrate 206 have a similar shape and size to be secured thereto. It is noted that the rigid support base 404, the electrode assembly 406 and the encapsulating member 402 may have an alternative shape or geometry selected as needed to accommodate the geometry of a workpiece, such as the substrate 206. For example, although the substrate carrier 151 is shown with a rectangular aerial extent, it is contemplated that the aerial extent of the substrate carrier 151 may alternatively have other geometric forms to accommodate different substrates, such as a circular geometric form to accommodate a circular substrate.

In one embodiment, the rigid support base 404 may be fabricated from an insulating material, such as a dielectric material or a ceramic material. Suitable examples of the ceramic materials or dielectric materials include polymers (i.e., polyimide), silicon oxide, such as quartz or glass, aluminum oxide ($Al_2O_3$), aluminum nitride (AlN), yttrium containing materials, yttrium oxide ($Y_2O_3$), yttrium-aluminum-garnet (YAG), titanium oxide (TiO), titanium nitride (TiN), silicon carbide (SiC) and the like. Optionally, the rigid support base 404 may be a metal or metallic body having a dielectric layer disposed on the surface of the rigid support base 404 facing the electrode assembly 406.

The electrode assembly 406 is disposed on the rigid support base 404 and includes at least two distributed electrodes 408, 410. Each electrode 408, 410 may be charged with different voltages or polarities when a chucking voltage is applied thereto, thus generating an electrostatic force. The electrodes 408, 410 of the electrode assemblies 406 are configured to distribute the electrostatic force along a distance at least two times with width of the substrate carrier 151. Each electrode 408, 410 may have a plurality of geometric forms interleaved or interposed among a plurality of geometric forms of the other electrode. As shown in FIG. 4A, a plurality of electrode fingers 420 comprising electrode 408 are interleaved with plurality of electrode fingers 422 comprising electrode 410. It is believed that the interleaved fingers 420, 422 of the distributed electrodes 408, 410 provides local electrostatic attraction distributed across a large area of the substrate carrier 151 which in the aggregation provides a high chucking force while using less chucking power. The electrode fingers 420, 422 may be formed to have different shapes, lengths and geometry. In one example, one or both of the electrode fingers 420, 422 may be formed from interconnected electrode islands 424. Interconnections 426 between electrode islands 424 may be in the plane of the electrodes 408, 410 as shown in FIG. 4A, or out of plane, such as in the form of jumpers and/or vias. In one embodiment, the electrode finger 420, 422 has a width 416 of between about 0.25 mm and about 10 mm.

In one embodiment, the electrode assembly 406 may be fabricated from a metallic material, such as aluminum silicon alloy, having a coefficient of thermal expansion similar to the adjacent encapsulating member 402 and the rigid support base 404. In one embodiment, the coefficient of thermal expansion of the electrode assembly 406 is between about 4 μm/(m*K) and about 6 μm/(m*K), and is generally within 20 percent of the coefficient of thermal expansion of the encapsulating member 402.

Between each of the electrode fingers 420 of the first electrode 408, spaces 433 are defined to receive electrode fingers 422 of the second electrode 410. The spaces 433 may be an air gap, filled with a dielectric spacer material, or filled with at least one of the rigid support base 404 or encapsulating member 402.

Vias 460, 462 may be formed through the rigid support base 404 to couple the first and the second electrodes 408, 410 to the chucking power source 240. In some embodiments, an optional on-board power source 440 may be disposed in the rigid support base 404 and connected to the first and the second electrodes 408, 410 by the vias 460, 462 to provide power for chucking the substrate 206. The on-board power source 440 may be a battery, capacitor, supercapacitor, ultrabattery or other suitable energy storage device. For example, the on-board power source 440 may be a lithium ion battery and may have terminal connections (shown as connector 350b in FIG. 3B) on the exterior of the rigid support base 404 for recharging the on-board power source 440 without removal from the rigid support base 404 or system 101.

The encapsulating member 402 is disposed on the rigid support base 404 sandwiching the electrode assembly 406 to form the body 270 of the substrate carrier 151 as a unitary structure. The encapsulating member 402 is positioned on the electrode assembly 406 to provide an insulating surface on which the substrate 206 is chucked. The encapsulating member 402 may be fabricated from a material having thermal properties, e.g., coefficient of thermal expansion, substantially matching that of the underlying electrode assembly 406. In some embodiments, the material utilized to fabricate the encapsulating member 402 is also utilized to fabricate the rigid support base 404.

After the encapsulating member 402, the electrode assembly 406 and the rigid support base 404 are stacked together, a bonding process, such as an annealing process, is performed to fuse the encapsulating member 402, the electrode assembly 406 and the rigid support base 404 together, forming a laminated structure comprising the body 270 of the substrate carrier 151. In the embodiments wherein the encapsulating member 402, the electrode assembly 406 and the rigid support base 404 may be required to operate in a high temperature environment, e.g., greater than 300 degrees Celsius, the materials utilized to fabricate these three components may be selected from heat resistance materials, such as ceramic materials or glass materials, that can sustain high thermal treatment during the annealing process. In one embodiment, the encapsulating member 402 and the rigid support base 404 may be fabricated from a ceramic material, a glass material, or a composite of ceramic and metal material, providing good strength and durability as well as good heat transfer properties. The materials selected to fabricate the encapsulating member 402 and the rigid support base 404 may have a coefficient of thermal expansion that is substantially matched to the intermediate electrode assembly 406 to reduce thermal expansion mismatch, which may cause stress or failure under high thermal loads. In one embodiment, the coefficient of thermal expansion of the encapsulating member 402 is between about 2 μm/(m*K) and about 8 μm/(m*K). Ceramic materials suitable for fabricating the encapsulating member 402 and the rigid support base 404 may include, but not limited to, silicon carbide, aluminum nitride, aluminum oxide, yttrium containing materials, yttrium oxide ($Y_2O_3$), yttrium-aluminum-garnet (YAG), titanium oxide (TiO), or titanium nitride (TiN). In another embodiment, the encapsulating member 402 and the rigid support base 404 may be fabricated from a composite material includes a different composition of a ceramic and metal, such as metal having dispersed ceramic particles.

During operation, a charge may be applied to the first electrode 408 and a different charge may be applied to the second electrode 410 to generate an electrostatic force. The different charge may be an opposite, lower or high charge than the charge applied to the first electrode 408. During chucking, the electrostatic force generated by the electrodes 408, 410 securely holds the substrate 206 to the substrate supporting surface 276 of the encapsulating member 402. As the power supplied from the chucking power source 240 is turned off, the charges present at the interface 418 between the electrodes 408, 410 may be maintained over a long period of time, thus allowing the substrate 206 to remain chucked to the substrate carrier 151 after power has been removed. To release the substrate held on the substrate carrier 151, a short pulse of power in the opposite polarity may be provided to the electrodes 408, 410 more quickly to remove the charge present in the interface 418.

The electrodes 408, 410 may also be selectively operated in a first mode that that chucks the mask 132a, 132b (as shown in FIGS. 1A-1D) and substrate 206 to the substrate carrier 151, and a second mode that at least does not chuck the mask 132a, 132b to the substrate carrier 151. In one example, the first mode may energize the electrodes 408, 410 of the electrode assembly 406 in a manner that causes the electrode assembly 406 to operate as a bipolar electrostatic chuck. Operating as a bipolar electrostatic chuck, the first electrode 408 of the electrode assembly 406 coupled to the substrate carrier 151 is energized at a first positive voltage while the second electrode 410 of the electrode assembly 406 coupled to the substrate carrier 151 is energized at a first negative voltage. The resultant bipolar electrostatic force generated will chuck both the grounded metal mask 132a, 132b and substrate 206 to the substrate carrier 151. Operating as a unipolar (i.e., mono-polar) electrostatic chuck, the first electrode 408 of the electrode assembly 406 coupled to the substrate carrier 151 is energized at a positive voltage while the second electrode 410 of the electrode assembly 406 coupled to the substrate carrier 151 is energized at or near zero voltage. The resultant unipolar electrostatic force generated will chuck only the substrate 206 to the substrate carrier 151, generating little or no force, which could chuck the grounded metal mask 132a, 132b to the carrier 151. Since the control electronics 356 on-board the substrate carrier 151 may independently address (i.e., select) which electrode assemblies 406 will be operated in the first or second mode, the control electronics 356 thus also selects which portions of the metal mask 132a, 132b are chucked to the substrate carrier 151.

Figure 4B:
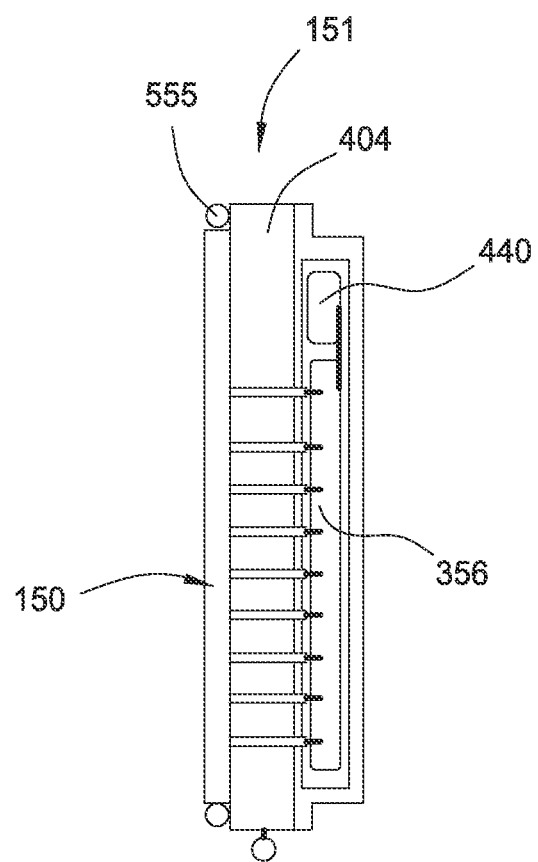
FIG. 4B depicts a side view of one embodiment of a substrate carrier in vertical orientation.

FIG. 4B depicts side view of the substrate carrier 151 in a vertical orientation. As discussed above in FIG. 4A, the substrate carrier 151 includes the integrated electrostatic chuck 150 disposed on the rigid support base 404. A plurality of electronic leads 490 may electrically couple the electrode assembly 406 to the control electronics 356 present in the rigid support base 404. Alternatively, the leads coupling the electrostatic chuck 150 to the control electronics 356 may be routed on the exterior of the substrate carrier 151 or base 404, for example in grooves (not shown). A sealing ridge, elastomeric seal or o-ring 555 is present projecting above the substrate supporting surface 276 to contact the substrate 206 in a manner that confines the heat transfer medium under the substrate 206, as further discussed below in FIGS. 5A-5C.

Figure 5A:
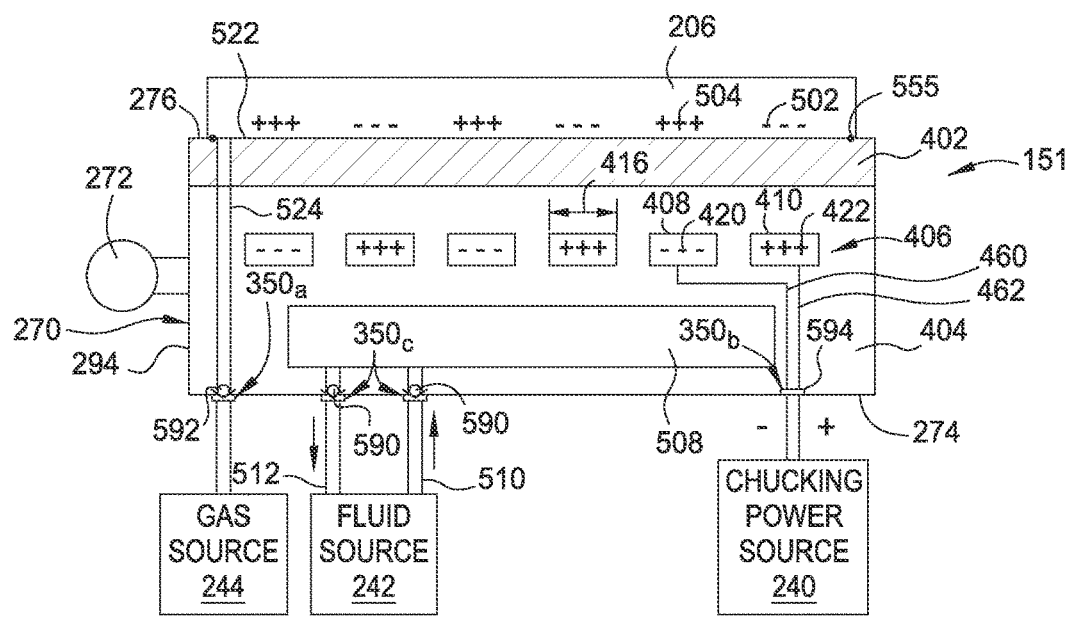
FIG. 5A depicts a cross sectional view of a substrate support plate of a substrate carrier with integrated electrostatic chuck positioned in a horizontal orientation.

FIG. 5A depicts a cross sectional view of the substrate carrier 151 with integrated the electrode assembly 406. It is noted that the substrate carrier 151 may be disposed on, embedded, implanted, or installed in any other suitable location or devices, such as robot blades, conveyors, a vertical or horizontal substrate supports, or other location within a processing system where a substrate positioning or transfer is desired. Furthermore, the substrate carrier 151 may be used in other processing tools and equipment, including processing equipments where the substrate carrier 151 is subjected to ambient atmosphere, vacuum conditions or any elevated pressure conditions.

As depicted in the cross sectional view of FIG. 5A, a negative charge may be applied to the first electrode 408 and a positive charge may be applied to the second electrode 410 to induce charges with opposite polarities, i.e., positive charges and negative charges, the substrate 206 thereby generating an electrostatic force that chucks the substrate 206 to the substrate supporting surface 276 of the substrate carrier 151. For example, negative charges on the electrode fingers 420 of the first electrode 408 may induce the substrate 206 to locally generate positive charges 504, so as to create electrostatic force to securely position to the substrate 206 on the substrate supporting surface 276 of the substrate carrier 151. Similarly, positive charges on the electrode fingers 422 of the second electrode 410 may induce the substrate 206 to locally generate negative charges 502. Due to the interleaving electrode fingers 420, 422 of the first and the second electrode 408, 410, the localized electrostatic field distributed the interface 418 is very long compared to conventional bi-polar electrostatic chucks, thereby generating an electrostatic force that retains the substrate 206 to the substrate supporting surface 276 of the substrate carrier 151 for extended periods well after power has been removed from the electrode assemble 406. The long chucking time without power being supplied to the electrode assembly 406 reduces the likelihood of charging defects formed on the substrate 206, especially in a thin substrate less than 200 μm, while helping to reduce substrate breakage and damage. Moreover, the long interface 418 allows electrostatic force sufficient to chuck the substrate 206 to be generated while utilizing less power as compared to conventional electrostatic chucks.

As earlier discussed with reference to FIG. 3B, the substrate carrier 151 may include a quick/instant disconnect mechanism that comprises quick electrical disconnects. The connector $350_b$ may be at least one of at least one of a contact pad, a plug and socket connector, a banana connector, a spade connector and a screw terminal. In the embodiment depicted in FIG. 5A, the connector $350b$ is in the form of contact pads 594 to allow the power source 240 to be quickly and automatically disconnected from the electrode assembly 406. The contact pads 594 may be formed on the bottom surface 274 or sides 294 of the rigid support base 404. The contact pads 594 are coupled to the electrode assembly 406 through the vias 460, 462. An actuator $352b$ (shown in FIG. 3B) may be disposed in the substrate loading stations 166A, 166B, and optionally the processing chambers 110A, 110B, to allow the electrode assembly 406 to be energized by the power source 240, and/or to allow the power source 240 to periodically recharge the optional energy storage device 440 (not shown in FIG. 5A). Automatically connection and disconnection is intended to mean that the contact pads 594 allow the electrode assembly 406 to be connected/disconnected from the power source 240 while the system 101 is operating without manual intervention. The connection/disconnection of the other sources 242, 244 may be similarly configured.

As discussed above, the substrate carrier 151 is configured to thermally control the temperature of the substrate 206. In one embodiment, the support base 404 of the carrier 151 includes a cooling/heating reservoir 508. The reservoir 508 is configured to receive a temperature regulating medium, such as a fluid, gas or combination thereof, from the fluid source 242. The reservoir 508 is connected to the fluid source 242 through connectors 350c shown in FIG. 5A as an inlet port 510 and an outlet port 512. The cooling/heating reservoir 508 may be configured to control the lateral temperature profile of the substrate supporting surface 276, for example, by having greater circulating a volume of temperature regulating medium in one region of the carrier 151 relative to another. Although the temperature regulating medium may be circulated through the reservoir 508 while coupled to the fluid source 242, each of the ports 510, 512 may include integral check or isolation valves which allow the temperature regulating medium to remain trapped within the reservoir 508 of the carrier 151 while the carrier 151 is disconnected from the fluid source 242 and moved through the system 101. The trapped temperature regulating medium provides a heat source (or sink, depending on temperature differentials) which serves to retain the substrate 206 at or near a desired temperature for longer periods as compared to a substrate support without additional temperature control features. The temperature of the substrate supporting surface 276 and substrate 206 retained thereon may be monitored using a plurality of temperature sensors (not shown).

To further enhance thermal exchange between the substrate supporting surface 276 of the substrate carrier 151 and substrate 206, a heat transfer medium may be provided therebetween. The heat transfer medium is provided to the substrate supporting surface 276 through a gas passage 524 through the body 270 of the substrate carrier 151. The heat transfer medium may be in the form of a backside gas supplied from the gas source 244 through the passage 524 formed through the body 270 to a portion 522 of the substrate supporting surface 276 disposed below the substrate 206. The heat transfer medium, such as helium, argon, nitrogen and the like, provides good thermal conduction between the substrate 206 and substrate supporting surface 276. The passage 524 terminates to the connector 350a. The connector 350a may include an integral check valve or isolation which allows a residual amount of heat transfer medium gas to be retained between the substrate 206 and the substrate supporting surface 276 of the substrate carrier 151 after the gas source 244 has been removed. Trapping of the heat transfer medium between the substrate 206 and the substrate carrier 151 may be assisted by a sealing ridge, elastomeric seal or o-ring 555 projecting above the substrate supporting surface 276 to contact the substrate 206 in a manner that confines the heat transfer medium under the substrate 206. The heat transfer medium may be introduced between the substrate 206 and the portion 522 of the substrate supporting surface 276 at a desired pressure, such as between 1 Torr to 3 Torr, to assist chucking the substrate 206 on the substrate carrier 151. Additionally, when the substrate is released from the substrate carrier 151, the heat transfer medium or other gas may be supplied to the interface between the substrate 206 and the substrate supporting surface 276 to help release the substrate 206 from the carrier 151.

The region between the substrate 206 and the substrate supporting surface 276 may optionally be evacuated through the passage 524 (or other passage) to assist securing the substrate 206 to the carrier 151 prior to chucking. For example, the gas source 244 may also be configured to draw a vacuum through the passage 524 to generate a vacuum that temporarily secures the substrate 206 to the carrier 151, after which power may be provided to the electrode assembly 406 to electrostatically secure the substrate 206 to the carrier 151. Once the substrate 206 is electrostatically secured to the carrier 151, the region between the substrate 206 and the substrate supporting surface 276 may be charged with a heat transfer medium as described above.

Figure 5B:
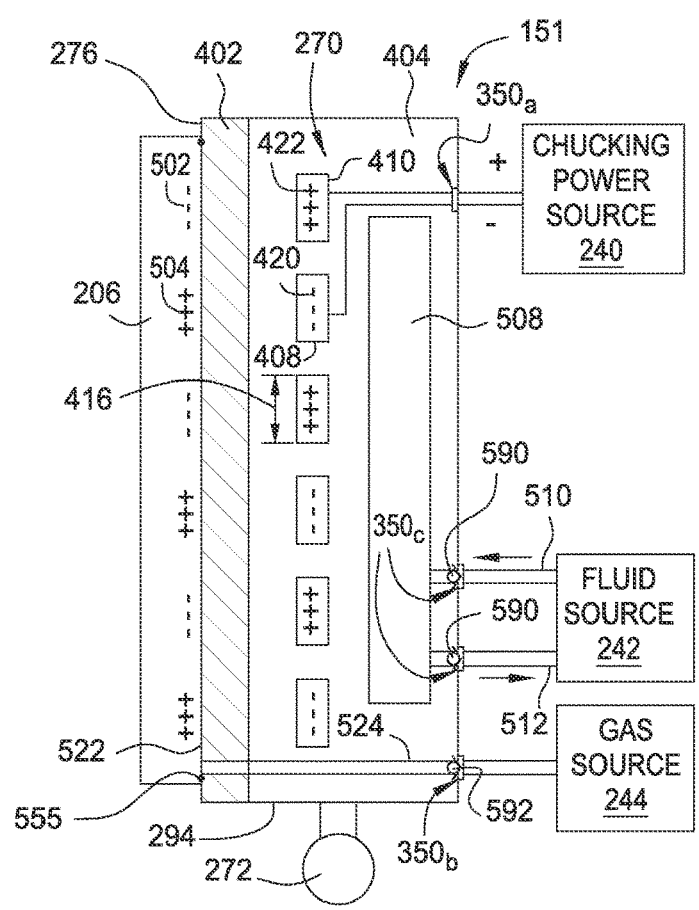
FIG. 5B depicts a cross sectional view of the substrate carrier with integrated electrostatic chuck positioned in a vertical orientation.

FIG. 5B depicts a cross sectional view of the substrate carrier 151 rotated to a vertical orientation. When in the vertical orientation, the guide rail 272 of the substrate carrier 151 is generally orientated below the substrate 206 to allow the carrier 151 to interface with the drive system 200, as shown in FIG. 2. It is contemplated that the guide rail 272 of the substrate carrier 151 may be orientated above the substrate 206 for interfacing with drive systems that engage the carrier from above the substrate.

Figure 5C:
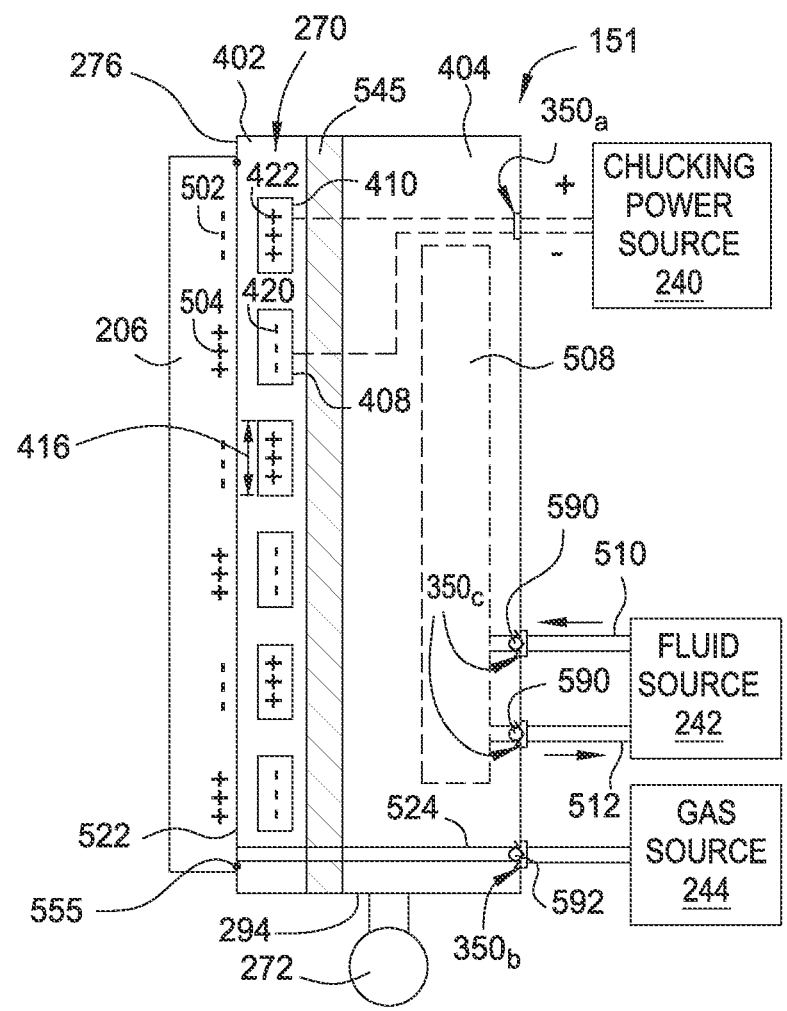
FIG. 5C depicts a cross sectional view of another embodiment of a substrate carrier with integrated electrostatic chuck positioned in a vertical orientation.

FIG. 5C depicts a cross sectional view of yet another embodiment of the substrate carrier 151 having an additional expansion compensation layer 545 disposed between the encapsulating member 402 and the rigid support base 404. The expansion compensation layer 545 is selected to have a coefficient of thermal expansion similar to that of the encapsulation member, yet be readily attachable to the support base 404. In this embodiment, the electrode assembly 406 may be disposed in the encapsulating member 402. The expansion compensation layer 545 may alternatively have a coefficient of thermal expansion between that of the electrostatic chuck 150 and the support base 404. Thus, the expansion compensation layer 545 serves prevent delamination of the encapsulating member 402 from the rigid support base 404 due to differences in thermal expansion. In one embodiment, the expansion compensation layer 545 is a nickel-cobalt ferrous alloy, such as KOVAR™ material. The expansion compensation layer 545 may also be segmented such that each one or group of the electrode assemblies 406 is attached to the base 404 using a separate expansion compensation layer 545.

In the embodiment depicted in FIG. 5C, the cooling/heating reservoir 508 formed in the rigid support base 404 and/or the gas passage 524 through the body 270 of the carrier 151 for supplying backside gas may be optionally eliminated. In embodiments wherein the cooling/heating reservoir 508 is not present, the mass of the rigid support base 404 may be increased to provide a thermal reservoir which assists dampening temperature changes in the substrate during processing.

Figure 6:
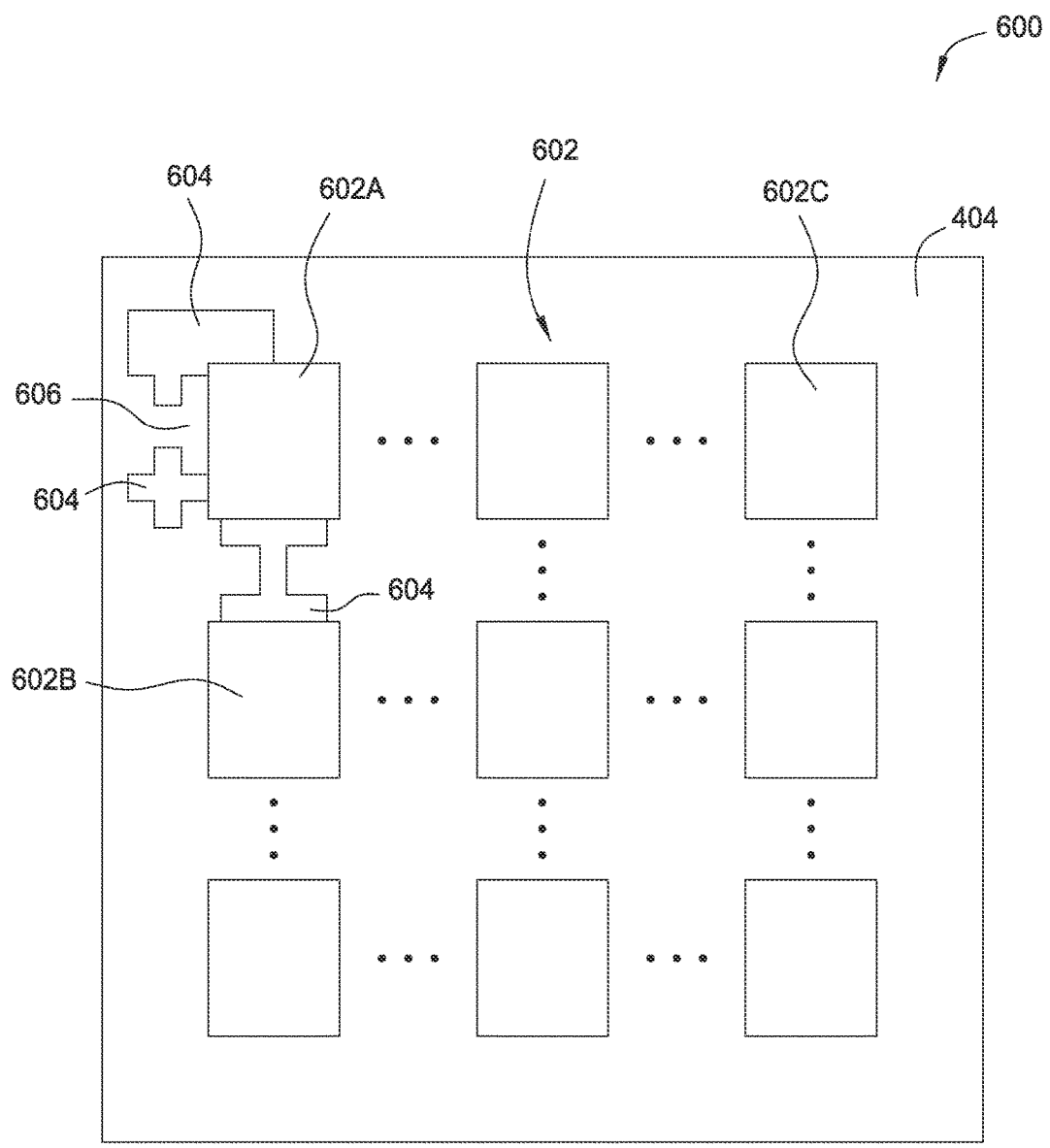
FIG. 6 depicts a front view of a substrate carrier illustrating an array of electrode assembly.

FIG. 6 depicts another embodiment of substrate carrier 600 with an array of separate embedded electrode assemblies 602 (some of which labeled as 602A, 602B and 602C) disposed on the rigid support base 404. Instead of a single large electrode assembly 406 as depicted in FIG. 4, multiple electrode assemblies 602 are arranged in an array across the surface of the carrier 600. The electrode assemblies 602 may be energized simultaneously, energized individually or may be energized in groups of one or more electrode assemblies 602. During processing, the substrate 206 along with the substrate carrier 600 may be subject to thermal expansion. It is believed that utilizing multiple electrode assemblies 602 may permit the electrode assemblies 602 to move separately due to thermal expansion, so as to prevent the substrate carrier 600 from being overly stressed during the thermal processing, which could result in deformation or damage to the substrate carrier 600. A plurality of resilient coupling 604 may couple adjoining electrode assemblies 602 so as to maintain each electrode assembly 602 of the substrate carrier 600 at desired relative locations while permitting some motion. In one embodiment, the electrode assembly 602 may be separated by resilient couplings 604 across openings 606 defined between the electrode assemblies 602 which will allow the electrode assemblies 602 to displace when subjected to temperature changes without creating undue stress on the carrier 600.

In another embodiment, the electrode assemblies 602 may be selectively energized and de-energized so that the workpiece (e.g., substrate) and/or mask may be held to the carrier 600 in different locations at different times. Thus, by sequencing which electrode assemblies 602 are actively retaining the workpiece to the carrier 600, for example in a lateral direction across the workpiece, stress due to thermal expansion may be reduces as compared to carriers which continuously hold the entire substrate over a change in temperature.

Figure 7:
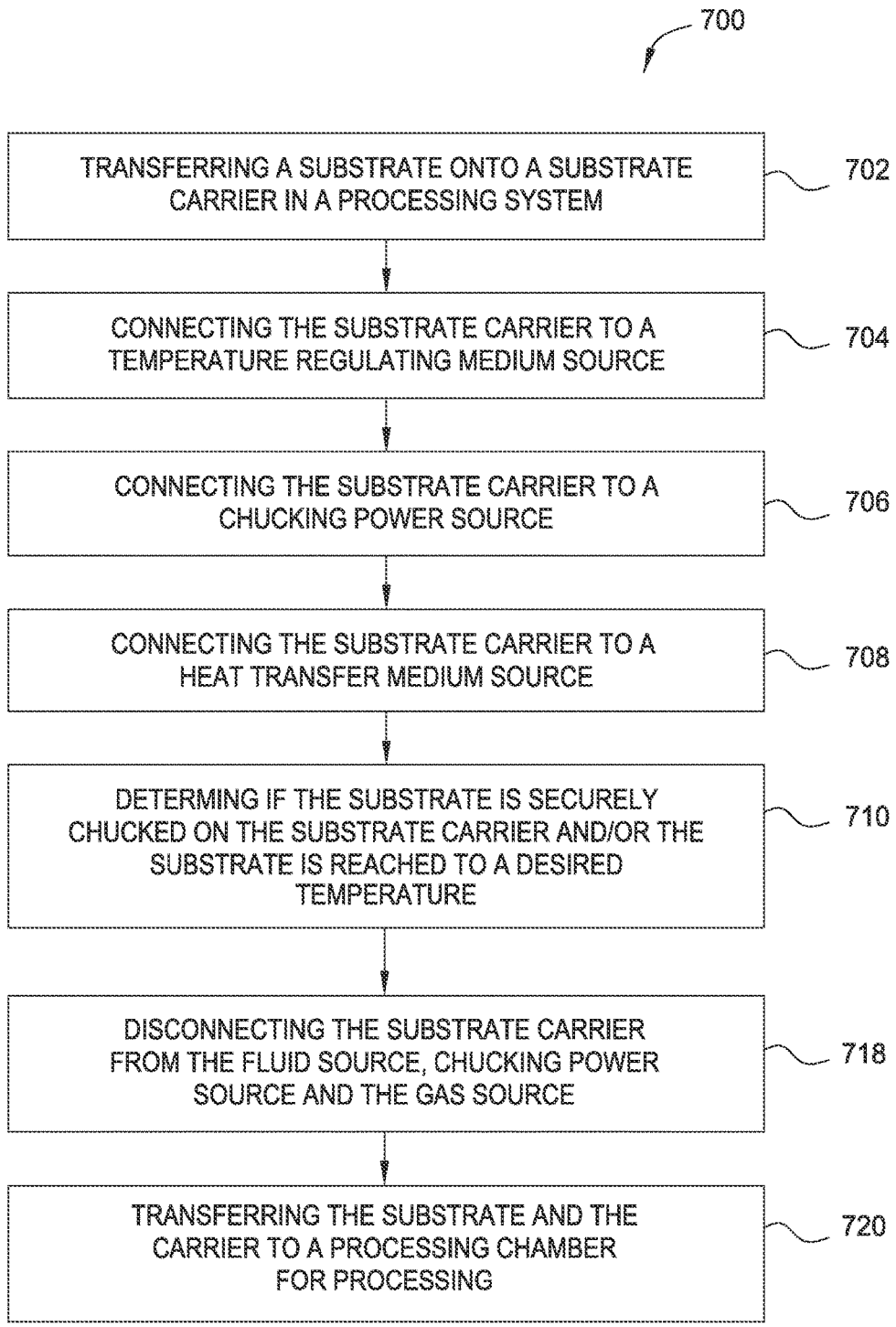
FIG. 7 depicts a flow diagram of a method for transferring a substrate using the substrate carrier with integrated electrostatic chuck provided in accordance with one embodiment of the present invention.

FIG. 7 depicts a flow diagram of a method for transferring a substrate through a vertical processing system using substrate carrier having an integrated electrostatic chuck. The substrate carrier utilized to transfer the substrate may be the substrate carrier 151, as discussed above with referenced to FIGS. 1-5C, or other suitable substrate carrier adapted to include features of the disclosure.

The method 700 begins at block 702 by transferring a substrate, such as the substrate 206 described above, onto a substrate carrier, such as the substrate carrier 151, disposed in the substrate loading stations 166A, 166B in the processing system 101, or other processing system. The substrate 206 may be loaded onto the substrate carrier 151 while the carrier 151 is in a substantially horizontal orientation, for example, while disposed on the flip table 180.

At block 704, the substrate carrier 151 is connected to the fluid source 242. The substrate carrier 151 may be connected to the fluid source 242 prior to, during or after the substrate 206 is loaded onto the carrier 151 in any of the substrate loading stations 166A, 166B, substrate load lock chambers 168A, 168B or the substrate processing chamber 110A, 110B in any order as needed.

As discussed above, the fluid source 242 may provide temperature regulating medium to the cooling/heating reservoir 508 formed in the support base 404. The temperature regulating medium may be controlled at a temperature between about 5 degrees Celsius and about 120 degrees Celsius so as to regulate the substrate temperature prior to, during or after processing.

At block 706, the chucking power source 240 is connected to the electrode assembly 406. The chucking power source 240 supplies a DC or AC power to the electrode assembly 406 so as to generate an electrostatic chucking force utilized to securely chuck the substrate 206 on the substrate carrier 151. In one embodiment, the chucking power source 240 may inductively couple power to chuck the substrate 206 remotely from the carrier 151. The electrostatic chucking force is sufficient to hold the substrate 206 to the carrier 151 while the carrier 151 is in a vertical orientation. Alternatively, the substrate may be chucked using power provided to the electrode assembly 406 by the energy storage device 440 disposed on-board the carrier 151.

Similarly, the substrate carrier 151 may be connected to the chucking power source 240 prior to, during or after the substrate 206 is loaded onto the carrier 151 in any of the substrate loading stations 166A, 166B, substrate load lock chambers 168A, 168B or the substrate processing chamber 110A, 110B in any order as needed.

At block 708, the gas source 244 is connected to the carrier 151 to at least one of provide a heat transfer medium or to vacuum chuck the substrate 206 to the substrate carrier 151. In one embodiment, prior to the substrate 206 being electrostatically chucked to the substrate supporting surface 276, the gas source 244 is utilized to pump out gases present between the backside of the substrate 206 and the substrate supporting surface 276 so as to assist securing the substrate 206 to the substrate carrier 151. In embodiments wherein the substrate 206 is vacuum chucked to the carrier 151, a heat transfer medium may be optionally provided between the backside of the substrate 206 and the substrate supporting surface 276 after the substrate has been electrostatically chuck to the substrate carrier 151.

Similarly, the substrate carrier 151 may be connected to the gas source 244 prior to, during or after the substrate 206 is loaded onto the carrier 151 in any of the substrate loading stations 166A, 166B, substrate load lock chambers 168A, 168B or the substrate processing chamber 110A, 110B in any order as needed.

It is noted that the process described in blocks 704, 706, and 708 of method 700 may be performed in different order or simultaneously.

At block 710, an inspection process may be performed to determine if the sources connected to the carrier 151 may be disconnected. For example, the sources 240, 242, 244 may be disconnected at block 718 once the substrate supporting surface 276 and/or substrate 206 has reached to a predetermined temperature, the substrate is securely chucked on the substrate supporting surface 276, and the heat transfer medium has been provided to the interface between the substrate 206 and the substrate supporting surface 276 of the carrier 151. If the temperature of the substrate or carrier has not reached to the desired temperature, the temperature regulating media provided to the reservoir 508 can then be continuously circulated or adjusted in temperature, until the desired temperature of the substrate or carrier is reached. Similarly, the inspection process may be performed to determine if the substrate is securely chucked on the substrate supporting surface 276. If the substrate 206 is not yet securely chucked on the carrier 151, the chucking power can then be applied to the electrode assembly 406 for a longer period or at a higher voltage. As discussed above, the interface between the substrate 206 and the substrate supporting surface 276 may also be evacuated prior to providing the electrostatic force.

At block 718, after the sources 240, 242, 244 have been decoupled from the substrate carrier 151, the substrate carrier 151 is ready for transfer to the load lock chambers 168A, 168B and further transfer to the processing chambers 110A, 110B for processing of the substrates 206.

In some embodiments wherein the carrier includes an on-board power source 440, the procedure described at block 702 and other references to the power source 240 may be omitted.

At block 720, the substrate 206 chucked on the substrate carrier 151 is transferred through the load lock chambers 168A, 168B to the processing chambers 110A, 110B for processing. Alternatively, as discussed above, the process described in blocks 704, 706, 708 may also be performed in the substrate load lock chambers 168A, 168B and/or in the substrate processing chamber 110A, 110B.

If the substrate carrier 151 is in a horizontal position, the carriers 151 are rotated to a substantially vertical orientation prior to entering the load lock chambers 168A, 168B. After the substrates 206 disposed on the carriers 151 are processed in the processing chambers 110A, 110B, the substrate carriers 151 moved back through the system 101 to the substrate loading stations 166A, 166B. Once the substrate carriers 151 are back in the substrate loading stations 166A, 166B, the fluid source 242, chucking power source 240 and the gas source 244 may then be re-connected to the carriers 151 to control the temperature of the substrate, for example cool the substrate, and to provide a dechucking signal to the electrode assembly 406 so that the substrate 206 may be released from the carrier 151 and returned by the robots 164A, 164B to the substrate stacking module 162A, 162B.

In some embodiments, one or more of the sources 240, 242 or 244 may be temporally reconnected to the carrier 151 in the processing chambers 110A, 110B while the substrates 206 are processed. In such embodiments, the sources 240, 242 or 244 are disconnected from the carrier 151 after the substrates are processed so that the carriers 151 may be removed from the processing chambers 110A, 110B.

The substrate carrier 151 described above may be utilized in different ways during processing of a substrate. In embodiments wherein each or groups of the electrode assemblies are individually and addressably controllable, the carrier 151 may be utilized to chuck and release different portions of the mask 131 and/or the substrate during processing. Selectively releasing and chucking different portions of the mask 131 and/or the substrate 206 during processing enhances the ability to dynamically align the mask 131 while processing and/or release stresses caused by thermal expansion of the mask 131. The following are a few examples of methods for processing a substrate utilizing a carrier 151 that selectively chucks and releases portions of the mask 131 while depositing a material on the substrate 206. The examples are illustrative, and it is contemplated that the carrier 151 is readily adapted to process a substrate utilizing other methods.

Figure 8:
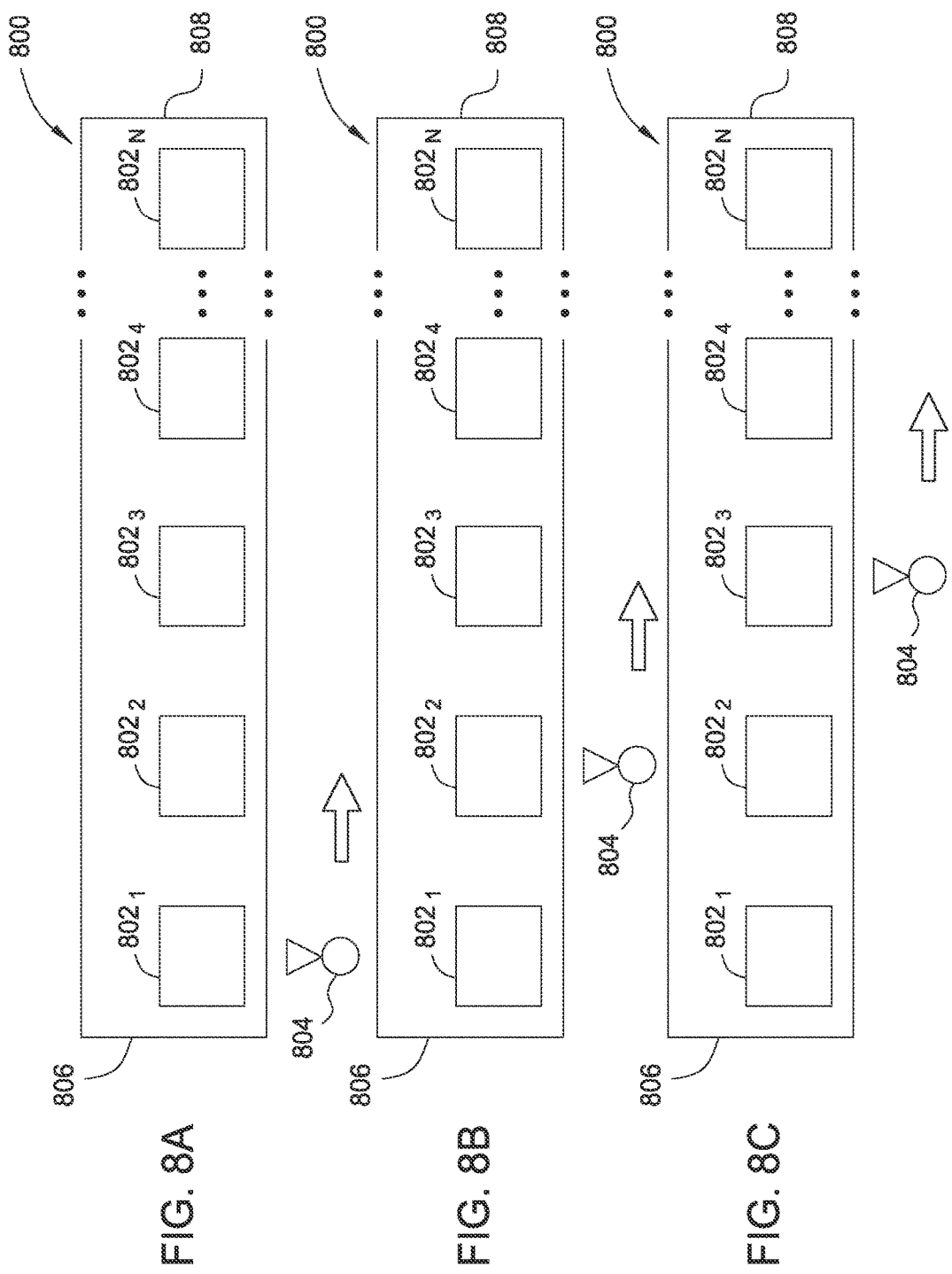
FIGS. 8A-8C are sequential views of a carrier and nozzle corresponding to various stages of a method for processing a substrate.
Figure 9:
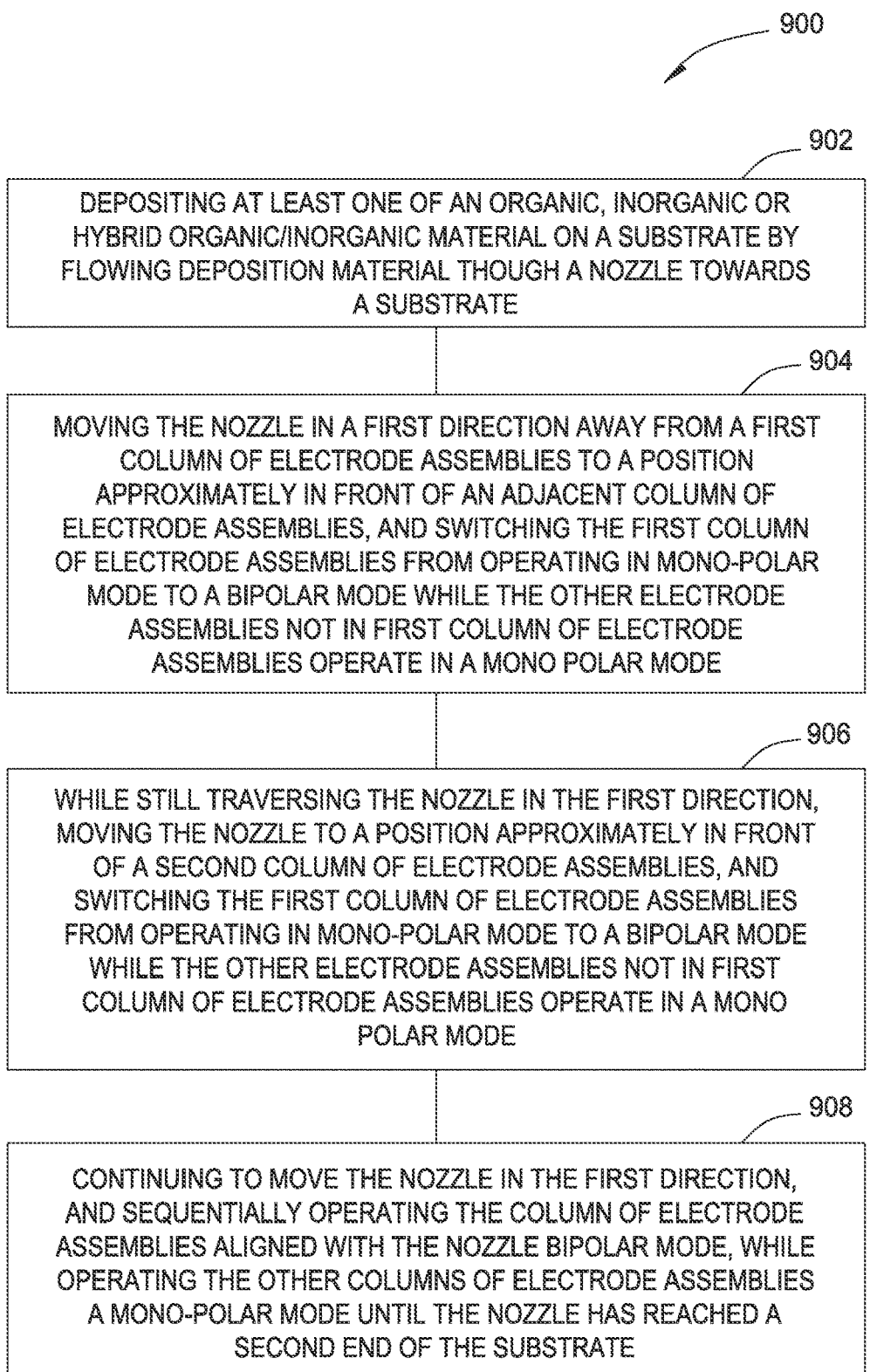
FIG. 9 is a flow diagram of a method for processing a substrate.

FIGS. 8A-8C are sequential views of a carrier 800 and nozzle 804 corresponding to one embodiment of a method 900 for processing a substrate illustrated in FIG. 9. Referring first to FIG. 8A, a top view of the carrier 800 is schematically illustrated positioned in a processing chamber, such as the processing chamber 110, having the dispense nozzle 804 in a first position relative to the carrier 800. The nozzle 804 and carrier 800 are configured to move relative to each other such that the nozzle 804 traverses across the carrier 800 to deposit a layer of material on the substrate, not shown in FIGS. 8A-8C. In the example depicted in FIG. 8A, the nozzle 804 is positioned at proximate a first edge 806 of the carrier 800, and moves in a first direction across the carrier 800 towards a second edge 808 of the carrier 800 which is opposite the first edge 806.

The carrier 800 is configured as described above with reference to the carrier 151, having a plurality of electrode assemblies, shown as columns of electrode assemblies $802_1$ through $802_N$, also referred collectively as electrode columns 802. Each electrode assembly within each electrode column $802_{1-N}$ includes a pair of electrodes which may be individually energized as described above, either within the electrode pair of a given electrode assembly, between electrode assemblies within an electrode column 802, or one electrode column 802 relative to one or more other electrode columns 802. Thus, each electrode within an electrode assembly may be addressably and individually energized relative to the other electrode assemblies. This allows the electrode assemblies to be operated in a first mode that chucks the mask and substrate, and a second mode that at least does not chuck mask. The second mode may be operable to chuck the mask. For example, in the first mode of operation, the electrode assemblies may be energized by the controller to operate as bipolar electrostatic chuck. As discussed above, when operated in a unipolar mode of operation, the carrier 800 may be operated to chuck both the substrate and mask, such as a grounded fine metal mask utilized in OLED deposition processes, to the carrier 800. In another example, in the second mode of operation, the electrode assemblies may be energized by the controller to operate as bipolar electrostatic chuck. When operated in a bipolar mode of operation, the carrier 800 may be operated to only chuck the substrate to the carrier 800, that is, the metal mask is not chucked to the carrier 800.

Referring now additionally to FIG. 9, a deposition method 900 is commenced to deposit at least one of an organic, inorganic or hybrid organic/inorganic material on the substrate at block 902. The deposition process begins at the first edge 806 of the substrate, for example, with the nozzle 804 positioned approximately in front of the electrode column $802_1$ nearest the first edge 806. The nozzle 804 dispenses a process gas suitable for depositing an organic material through an evaporation process. Alternatively, the layer of material may be deposited on the substrate utilizing other techniques, for example plasma enhanced chemical vapor deposition, among others.

While the nozzle 804 is positioned adjacent the electrode column $802_1$, the electrode assemblies within electrode column $802_1$ may be operating in a unipolar mode so as to chuck both the substrate and mask to the carrier 800. The other electrode assemblies not in electrode column $802_1$, i.e., within electrode columns $802_{2-N}$, may be operating in a bipolar mode so as to chuck only the substrate but not the mask to the carrier 800.

At block 904, the nozzle 804, traversing away from the first edge of the carrier 800, moves away from the electrode column $802_1$ to a position approximately in front of the electrode column $802_2$, as illustrated in FIG. 8B. When the nozzle 804 is positioned adjacent the electrode column $802_2$, the electrode assemblies within electrode column $802_2$ switch from operating in bipolar mode to a unipolar mode so as to chuck both the substrate and mask to the carrier 800. The other electrode assemblies not in electrode column $802_2$, i.e., within electrode columns $802_1$ and $802_{3-N}$, may operate in a bipolar mode so as to chuck only the substrate but not the mask to the carrier 800.

At block 906, the nozzle 804, while still traversing in the first direction away from the first edge 806 of the carrier 800, moves away from the electrode column $802_2$ to a position approximately in front of the electrode column $802_3$, as illustrated in FIG. 8C. When the nozzle 804 is positioned adjacent the electrode column $802_3$, the electrode assemblies within electrode column $802_3$ switch from operating in bipolar mode to a unipolar mode so as to chuck both the substrate and mask to the carrier 800. The other electrode assemblies not in electrode column $802_3$, i.e., within electrode columns $802_{1-2}$ and $802_{4-N}$, may operate in a bipolar mode so as to chuck only the substrate but not the mask to the carrier 800.

At block 908, the pattern of operating the electrode assemblies within the electrode column 802 positioned in front of the nozzle 804 in a bipolar mode, while operating the other electrode assemblies within the electrode columns 802 not positioned in front of the nozzle 804 in a unipolar mode continues until the nozzle 804 reaches the second end 808 of the carrier 800 adjacent the electrode column $802_N$. As the nozzle 804 at the completion of block 908 as completely traversed across the substrate, a uniform layer of deposition material has been deposited across the width of the substrate.

Thus, during the deposition method 900, only the electrode assemblies of the electrode columns 802 that are aligned with the nozzle 804 are operated in a manner that chucks the mask, while the electrode assemblies of the electrode columns 802 that are laterally off-set from the nozzle 804 are operated in a manner that chucks the substrate but not the mask. The controller may provide the appropriate signal to each of the electrode assemblies so as to synchronize the state (i.e., mode of operation) of the electrode assembly to the position of the nozzle 804 relative to the various electrode assemblies of the carrier. In one embodiment, the controller may select the mode of operation (i.e., mask chucking, non-mask chucking) of the electrode assemblies based on the start time of the deposition process and a predefined rate of nozzle advance. In another one embodiment, the controller may select the mode of operation of the electrode assemblies based on a sensed position of the nozzle 804 relative to the carrier. It is contemplated that other synchronization techniques may be utilized.

Figure 10:
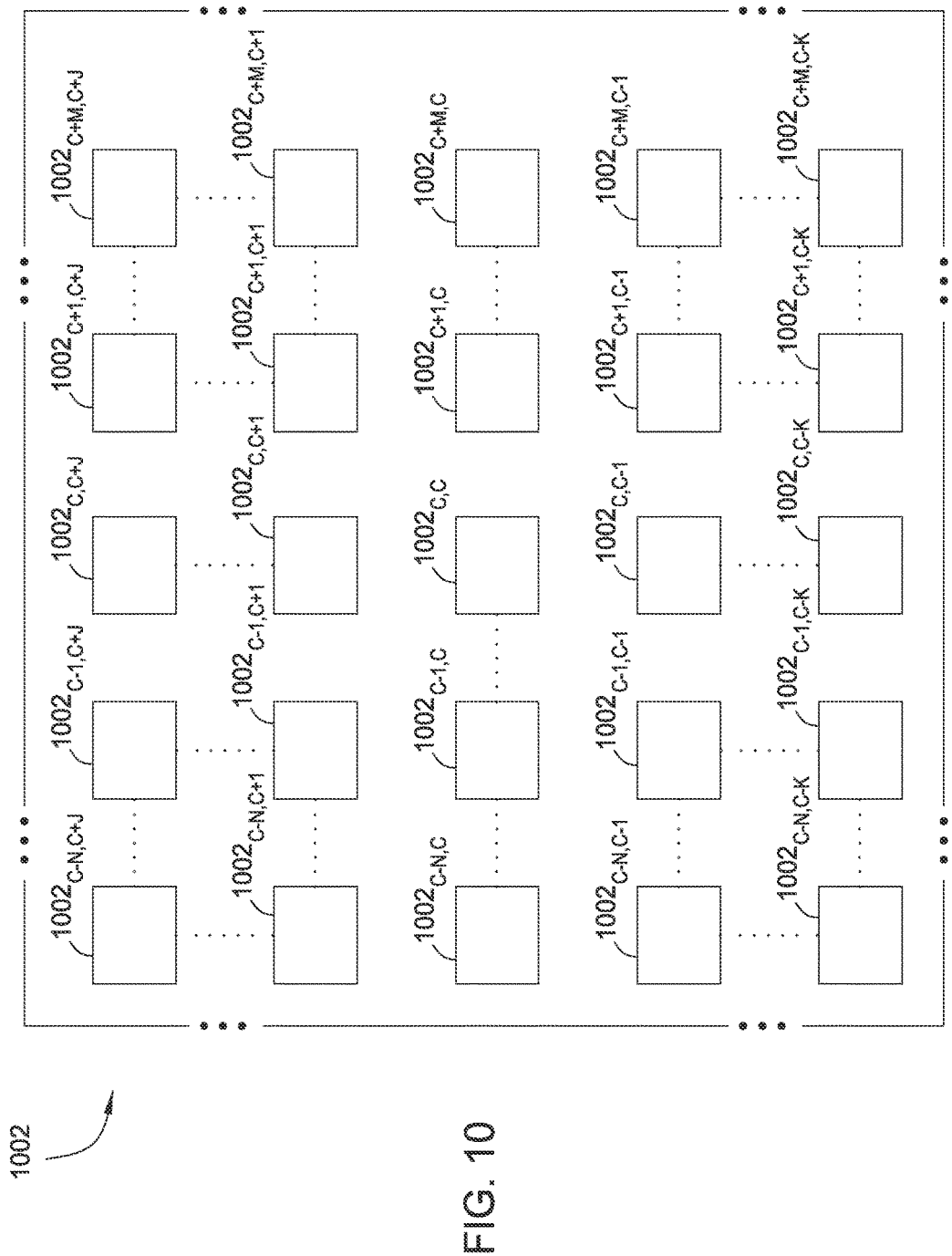
FIG. 10 is a schematic diagram of a carrier having an array of electrode assemblies.
Figure 11:
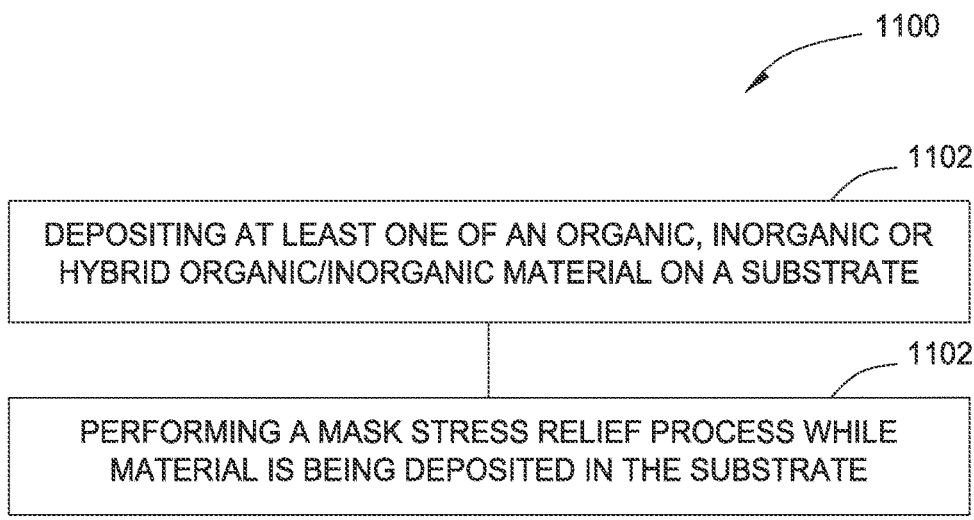
FIG. 11 is another flow diagram of a method for processing a substrate.

FIG. 10 is a schematic view of a carrier 1000 having an array of electrode assemblies which are provided to illustrate various methods for processing a substrate, an example of which is shown in the flow diagram of FIG. 11. The carrier 1000 is configured as described above with reference to the carrier 151, having an array of electrode assemblies (collectively referred to as 1002). An electrode assembly in the horizontal and vertical center of the carrier 1000 is designated as electrode assembly $1002_{C,C}$ as a point of reference for describing a method 1100 of processing a substrate illustrated in FIG. 11. The electrode assemblies 1002 in the array extend between electrode assembly $1002_{C-N,C+J}$ in the upper left-most corner of the carrier 1000, electrode assembly $1002_{C+M,C+J}$ in the upper right-most corner of the carrier, electrode assembly $1002_{C-N,C-K}$ in the lower left-most corner of the carrier 1000, electrode assembly $1002_{C+M,C-K}$ in the lower right-most corner of the carrier 1000. M, N, K and J are positive integers and denote the number of electrode assembles from the center in a Cartesian grid. Each or groups of the electrode assemblies 1002 be individually operated in modes that chuck or do not chuck the mask.

Referring now additionally to FIG. 11, a deposition method 1100 is commenced to deposit at least one of an organic, inorganic or hybrid organic/inorganic material on the substrate at block 1102. Examples of materials that may be deposited include silicon-containing materials, such as SiN, SiO, and SiON among others. The layer of material may be deposited in a processing chamber, such as the processing chamber 110 depicted in FIG. 1A-1E, or other suitable processing chamber. At block 1102, the mask and substrate are uniformly chucked to the carrier 1000 by operating the electrode assemblies 1002 in a unipolar mode.

At block 1104, a mask stress relief process is performed while material is still being deposited in the substrate and while the substrate remains chucked to the carrier 1000. The mask stress relief process selectively dechucks and rechucks the mask in a sequential manner to allows any expansion (or contraction) of the mask due to heating or cooling of the mask.

In mode of operation, the electrode assemblies are operated in a sequential, radially outward mask dechucking/rechucking sequence. The mask may be dechucked by changing the operation of an electrode assembly from a unipolar mode to a bipolar mode of operation, while the mask may be rechucked by changing the operation of an electrode assembly from a bipolar mode to a unipolar mode of operation For example, the electrode assemblies immediately outward of electrode assembly $1002_{C,C}$, that is electrode assemblies $1002_{C+1,\ C+1}$, $1002_{C-1,\ C+1}$, $1002_{C+1,\ C-1}$ and $1002_{C-1,\ C-1}$, are operated to dechuck at least the mask, while the outer electrodes 1002 operate to chuck the mask. Next, the electrode assemblies immediately outward of electrode assemblies $1002_{C+1,\ C+1}$, $1002_{C-1,\ C+1}$, $1002_{C+1,\ C-1}$ and $1002_{C-1,\ C-1}$, that is electrode assemblies $1002_{C+2,\ C+2}$, $1002_{C-2,\ C+2}$, $1002_{C+2,\ C-2}$ and $1002_{C-2,\ C-2}$, are operated to dechuck at least the mask, while the outer electrodes 1002 operate to chuck the mask. The sequence of dechucking the mask with sequentially outer electrode assemblies is continued until the electrode assemblies $1002_{C-N,\ C+J}$, $1002_{C-N,\ C-K}$, $1002_{C+M,\ C+J}$ and $1002_{C+M,\ C-K}$, are operated to dechuck at least the mask which allows the mask to expand outward while still be centered on the carrier, thus relieving thermal stresses created in the mask.

In another mode of operation, the electrode assemblies immediately above and below the center electrode assembly $1002_{C,\ C}$, that is electrode assemblies $1002_{X,\ C+1}$ and $1002_{X,\ C-1}$ are operated to dechuck at least the mask, while the outer electrodes 1002 operate to chuck the mask, where X is a positive integer or C. Next, the electrode assemblies immediately outward of electrode assemblies $1002_{X,\ C+1}$ and $1002_{X,\ C-1}$ that is electrode assemblies $1002_{X,\ C+2}$, and $1002_{X,\ C-2}$, are operated to dechuck at least the mask, while the outer electrodes 1002 operate to chuck the mask. The sequence of dechucking the mask with sequentially outer electrode assemblies is continued until the electrode assemblies $1002_{X,\ C+J}$, and $1002_{X,\ C-K}$, are operated to dechuck at least the mask which allows the mask to expand outward in the vertical direction while the mask is still centered on the carrier. The dechucking and chucking of the mask by operation of the electrode assemblies above the center electrode assembly $1002_{C,\ C}$ may occur simultaneously with, sequentially to, or in another order with, the electrode assemblies below the center electrode assembly $1002_{C,\ C}$.

Before, after or during the stress relief in the vertical direction, the electrode assemblies may be operated to relieve the stress in the horizontal direction. For example, the electrode assemblies immediately to the right and left the center electrode assembly $1002_{C,\ C}$, that is electrode assemblies $1002_{C+1,\ Y}$ and $1002_{C-1,\ Y}$ are operated to dechuck at least the mask, while the outer electrodes 1002 operate to chuck the mask, where Y is a positive integer or C. Next, the electrode assemblies immediately outward of electrode assemblies $1002_{C+1,\ Y}$ and $1002_{C-1,\ Y}$ that is electrode assemblies $1002_{C+2,\ Y}$ and $1002_{C-2,\ Y}$ are operated to dechuck at least the mask, while the outer electrodes 1002 operate to chuck the mask. The sequence of dechucking the mask with sequentially outer electrode assemblies is continued until the electrode assemblies $1002_{C+M,\ Y}$ and $1002_{C-N,\ Y}$ are operated to dechuck at least the mask which allows the mask to expand outward in the horizontal direction while the mask is still centered on the carrier. The dechucking and chucking of the mask by operation of the electrode assemblies to the right the center electrode assembly $1002_{C,C}$ may occur simultaneously with, sequentially to, or in another order with, the electrode assemblies to the left of the center electrode assembly $1002_{C,\ C}$.

In yet another mode of operation, the electrode assemblies 1002 may be operated to dechuck and recheck at least the mask in a first edge to opposite edge sequence, alone or in conjunction with dechuck and recheck at least the mask in a second edge to opposite edge sequence, wherein the first and second edges are perpendicular to each other. For example, of the outermost column of electrode assemblies $1002_{C-N,\ Y}$ may be operated to dechuck the mask while the outer electrodes 1002 operate to chuck the mask, where Y is a positive integer or C. Next, the column of electrode assemblies immediately inward of the electrode assemblies $1002_{C-N,\ Y}$, that is electrode assemblies $1002_{C-N-1,\ Y}$, are operated to dechuck at least the mask, while the other electrodes 1002 operate to chuck the mask. The sequence of dechucking the mask with sequentially outer electrode assemblies is continued until the electrode assemblies $1002_{C+M, Y}$ are operated to dechuck at least the mask which allows the mask to expand outward in the horizontal direction while the substrate is still chucked to the carrier.

Before, after or during the stress relief in the horizontal direction, the electrode assemblies may be operated to relieve the stress in the vertical direction. For example, For example, of the outermost row of electrode assemblies $1002_{X, C-K}$ may be operated to dechuck the mask while the other electrodes 1002 operate to chuck the mask, where X is a positive integer or C. Next, the column of electrode assemblies immediately above of the electrode assemblies $1002_{X, C-K}$, that is electrode assemblies $1002_{X, C-K-1}$, are operated to dechuck at least the mask, while the other electrodes 1002 operate to chuck the mask. The sequence of dechucking the mask with sequentially outer electrode assemblies is continued until the electrode assemblies $1002_{X, C+J}$ are operated to dechuck at least the mask which allows the mask to expand outward in the vertical direction while the substrate is still chucked to the carrier.

It is also contemplated that the progression of dechucking and rechucking of the electrode assemblies may progress in directions that are not parallel to a side of the carrier 1000, for example, a direction that is non-perpendicular to an edge of the carrier 1000.

By utilizing a substrate carrier with a temperature control and electrostatic chucking features which may be disconnected from the carrier while the carrier is transported through a processing system, the processing system and associated components may be simplified, thereby contributing to faster through-put and longer service intervals. Processing multiple substrates that are electrostatically chucked in a vertical orientation not only reduces the cost of manufacturing which may increase the manufacturer's profits, but also improve product yield and process reliability. Furthermore, although the substrate carrier was described herein in the context of a vertical processing system, the substrate carrier may be adapted for use in horizontal systems as well.

While the foregoing is directed to embodiments of the present invention, other and further embodiments of the invention may be devised without departing from the basic scope thereof, and the scope thereof is determined by the claims that follow.

What is claimed is:

1. A substrate carrier adapted to use in a processing system, the substrate carrier comprising:
    a support base;
    an electrode assembly having interleaved electrode fingers formed therein disposed on the support base;
    a controller on-board the substrate carrier, the controller adapted to control a state of the electrode assembly; and
    a connector coupled to the support base configured to electrically disconnect a power source to the electrode assembly, the support base and the electrode assembly comprising a unitary body adapted to be transported within a processing system.

2. The substrate carrier of claim 1, wherein the connector comprises:
    at least one of a contact pad, a plug and socket connector, a banana connector, a spade connector and a screw terminal.

3. The substrate carrier of claim 1, further comprising:
    an energy storage device on-board the substrate carrier and coupled to the electrode assembly.

4. The substrate carrier of claim 3, wherein the energy storage device is electrically coupled to the electrode assembly and the connector.

5. The substrate carrier of claim 1 further comprising:
    a rail extending from a side of the support base.

6. The substrate carrier of claim 5, wherein the rail is configured to interface with a drive system adapted to transport the body through the system.

7. The substrate carrier of claim 1, wherein the electrode assembly comprises:
    an array of independently controllable electrode assemblies.

8. The substrate carrier of claim 1, wherein the electrode assembly comprises:
    a plurality of distributed electrodes.

9. The substrate carrier of claim 8, wherein the distributed electrodes further comprises:
    at least a first electrode interleaving with a second electrode.

10. The substrate carrier of claim 8, wherein the energy storage device comprises:
    at least one of a battery, capacitor, supercapacitor and ultrabattery.

11. The substrate carrier of claim 1 further comprising:
    a reservoir disposed in the support base.

12. The substrate carrier of claim 11, wherein the reservoir is coupled to a connector having a check or isolation valve.

13. The substrate carrier of claim 1 further comprising:
    a connector for providing gas to a surface of the substrate carrier.

14. A processing system, comprising:
    (a) a substrate carrier comprising:
        a support base;
        a plurality of electrode assemblies disposed on the support base;
        a controller on-board the substrate carrier, the controller adapted to control a state of the electrode assembly; and
        a connector coupled to the support base configured to electrically disconnect a power source to the electrode assembly, the support base and the electrode assembly comprising a unitary body adapted to be transported within a processing system;
    (b) a processing chamber adapted to receive the substrate carrier having a substrate electrostatically coupled thereto; and
    (c) a mating connector operable to automatically couple to the connector.

15. The processing system of claim 14, wherein the mating connector is located in at least one of a loading system, a load lock chamber and a processing chamber.

16. The processing system of claim 14, further comprising:
    an energy storage device on-board the substrate carrier and coupled to the electrode assembly.

17. A method for transporting a substrate in a processing system, the method comprising:
    transferring a substrate onto a substrate carrier, wherein the substrate carrier comprises a controller on-board adapted to control a state of an electrode assembly in the substrate carrier;
    electrostatically chucking the substrate to the substrate carrier by powering an electrode assembly electrically coupled to a power source;
    electrically disconnecting the power source from the substrate carrier when the substrate is chucked on the substrate carrier; and transferring the substrate while electrostatically chucked to the substrate carrier in a substantially vertical orientation.

18. The method of claim 14, wherein electrically disconnecting the power source further comprises:
automatically disconnecting the power source from the substrate carrier in a processing chamber or in a substrate loading station.

\* \* \* \* \*

UNITED STATES PATENT AND TRADEMARK OFFICE
CERTIFICATE OF CORRECTION

PATENT NO. : 10,304,713 B2
APPLICATION NO. : 14/916676
DATED : May 28, 2019
INVENTOR(S) : John M. White et al.

It is certified that error appears in the above-identified patent and that said Letters Patent is hereby corrected as shown below:

On the Title Page

On the page 2, in Column 2, under "Other Publications", Line 5, delete "058380," and insert -- 056380, --, therefor.

In the Drawings

On sheet 11 of 15, in Figure 7, reference numeral 710, Line 1, delete "DETERMING" and insert -- DETERMINING --, therefor.

In the Specification

In Column 9, Line 14, delete "independtable" and insert -- independable --, therefor.

In Column 15, Line 19, delete "that that" and insert -- that --, therefor.

Signed and Sealed this
Twenty-third Day of July, 2019

Andrei Iancu
*Director of the United States Patent and Trademark Office*